United States Patent
Oh

(10) Patent No.: US 9,859,171 B2
(45) Date of Patent: *Jan. 2, 2018

(54) SEMICONDUCTOR DEVICE AND METHOD FOR MANUFACTURING THE SAME

(71) Applicant: SK hynix Inc., Gyeonggi-do (KR)

(72) Inventor: Dong-Yean Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/440,577

(22) Filed: Feb. 23, 2017

(65) Prior Publication Data

US 2017/0178977 A1 Jun. 22, 2017

Related U.S. Application Data

(63) Continuation of application No. 15/188,305, filed on Jun. 21, 2016, now Pat. No. 9,613,957.

(30) Foreign Application Priority Data

Dec. 22, 2015 (KR) .................. 10-2015-0183450

(51) Int. Cl.

| H01L 21/76 | (2006.01) |
|---|---|
| H01L 29/78 | (2006.01) |
| H01L 21/8238 | (2006.01) |
| H01L 21/762 | (2006.01) |
| H01L 27/092 | (2006.01) |
| H01L 29/423 | (2006.01) |
| G11C 7/06 | (2006.01) |
| G11C 7/12 | (2006.01) |
| H01L 21/8234 | (2006.01) |
| H01L 29/06 | (2006.01) |

(Continued)

(52) U.S. Cl.
CPC ...... *H01L 21/823878* (2013.01); *G11C 7/065* (2013.01); *G11C 7/12* (2013.01); *H01L 21/76224* (2013.01); *H01L 21/823412* (2013.01); *H01L 27/092* (2013.01); *H01L 27/0921* (2013.01); *H01L 29/0638* (2013.01); *H01L 29/0653* (2013.01); *H01L 29/4236* (2013.01); *H01L 29/66537* (2013.01); *H01L 29/7846* (2013.01); *H01L 21/823807* (2013.01); *H01L 29/4916* (2013.01)

(58) Field of Classification Search
CPC ... H01L 29/42; H01L 29/423; H01L 29/4236; H01L 29/49; H01L 29/491; H01L 29/4916; H01L 29/78; H01L 29/784; H01L 29/7846; H01L 27/09; H01L 27/092; H01L 21/76; H01L 21/762; H01L 21/7622; H01L 21/76224; H01L 21/82; H01L 21/823; H01L 21/8238; H01L 21/82387; H01L 21/823878
USPC ............................................... 257/376
See application file for complete search history.

(56) References Cited

U.S. PATENT DOCUMENTS 9,613,957 B1 * 4/2017 Oh .................. H01L 27/0921

\* cited by examiner

*Primary Examiner* — Monica D Harrison
(74) *Attorney, Agent, or Firm* — IP & T Group LLP

(57) ABSTRACT

A semiconductor device includes a first active region including at least one first recess; a second active region including at least one second recess; an isolation region including a diffusion barrier that laterally surrounds at least any one active region of the first active region and the second active region; a first recess gate filled in the first recess; and a second recess gate filled in the second recess, wherein the diffusion barrier contacts ends of at least any one of the first recess gate and the second recess gate.

8 Claims, 20 Drawing Sheets

(51) Int. Cl.
*H01L 29/66* (2006.01)
*H01L 29/49* (2006.01)

SEMICONDUCTOR DEVICE AND METHOD FOR MANUFACTURING THE SAME

CROSS-REFERENCE TO RELATED APPLICATION

This application is a continuation of U.S. patent application Ser. No. 15/188,305, filed on Jun. 21, 2016, which claims priority under 35 U.S.C. §119 to Korean Patent Application No. 10-2015-0183450, filed on Dec. 22, 2015. The disclosure of each of the foregoing application is incorporated herein by reference in its entirety.

TECHNICAL FIELD

Exemplary embodiments relate to a semiconductor device, and more particularly, to a semiconductor device including an isolation region and a method for manufacturing the same.

DISCUSSION OF THE RELATED ART

An isolation process is applied to semiconductor processing. Neighboring semiconductor structures or neighboring portions of a substrate may be isolated by the isolation process. Recently, the isolation process adopts STI (shallow trench isolation).

An STI region may neighbor or contact a doped region. Therefore, out-diffusion of a dopant from the doped region to the STI region may occur.

SUMMARY

Various embodiments are directed to a semiconductor device capable of preventing out-diffusion of a dopant and a method for manufacturing the same.

In an embodiment, a semiconductor device may include: a first active region including a first recess; a second active region including a second recess; a first recess gate filled in the first recess; a second recess gate filled in the second recess; and an isolation region surrounds the first active region and the second active region, wherein the isolation region includes a diffusion barrier contacts ends of at least any one of the first recess gate and the second recess gate.

In an embodiment, a semiconductor device may include: a first active region including a first recess; a second active region including a second recess; a first recess gate filled in the first recess; a second recess gate filled in the second recess; and an isolation region surrounds the first active region and the second active region, wherein the isolation region include a first diffusion barrier having a height and a width that completely cover both ends of at least any one of the first recess gate and the second recess gate; and a second diffusion barrier surrounding the first diffusion barrier and having a height and a width that completely cover both ends of at least any one of the first recess gate and the second recess gate.

In an embodiment, a semiconductor device may include: a first active region including a first recess; a second active region including a second recess; a first recess gate filled in the first recess; a second recess gate filled in the second recess; and an isolation region surrounds the first active region and the second active region, wherein the isolation region include a first diffusion barrier having a height and a width that completely cover both ends of at least any one of the first recess gate and the second recess gate; a buffer layer surrounding a lower portion of the first diffusion barrier; and a second diffusion barrier surrounding an upper portion of the first diffusion barrier on the buffer layer, and having a height and a width that completely cover both ends of at least any one of the first recess gate and the second recess gate.

In an embodiment, a method for manufacturing a semiconductor device may include: forming a trench in a substrate to define an active region; forming an isolation region in the trench, wherein the isolation region including a first diffusion barrier that surrounds a sidewall of the active region, and a second diffusion barrier that surrounds the first diffusion barrier; forming a recess in the active region; forming a gate layer fills the recess, wherein the gate layer includes a dopant; and patterning the gate layer to form a recess gate that is positioned in the recess. The first diffusion barrier has a height and a width that cover both ends of the recess gate. The first diffusion barrier and the second diffusion barrier are formed with heights and widths that cover both ends of the recess gate. Each of the first diffusion barrier and the second diffusion barrier may include a diffusion-suppressing species, and the buffer layer may include substantially no diffusion-suppressing species. The diffusion-suppressing species may include nitrogen, carbon, fluorine, boron, germanium, or a combination thereof. Each of the first diffusion barrier and the second diffusion barrier may include a silicon nitride, a silicon oxynitride, a boron-doped nitride, a carbon-doped nitride, a nitrogen-doped oxide, a fluorine-doped oxide, a germanium-doped oxide, a carbon layer, or a combination thereof.

The forming of the isolation region may include: forming a first diffusion barrier layer in a liner pattern over an inner surface of the trench; forming a buffer layer that partially fills the trench, over the first diffusion barrier layer; forming a second diffusion barrier layer that surrounds an upper portion of the first diffusion barrier layer, on the buffer layer; and planarizing the first diffusion barrier layer and the second diffusion barrier layer to form the first diffusion barrier and the second diffusion barrier, respectively. Each of the first diffusion barrier layer and the second diffusion barrier layer may include a diffusion-suppressing species. Each of the first diffusion barrier layer and the second diffusion barrier layer is formed of an undoped material, and after the performing of the planarization, the method may further include implanting diffusion-suppressing species into the first diffusion barrier layer and the second diffusion barrier layer.

The forming of the isolation region may include: forming a first diffusion barrier layer over an inner surface of the trench; forming a first buffer layer in a lower portion of the trench and over the first diffusion barrier layer; forming a second diffusion barrier layer that lines the first buffer layer and the first diffusion barrier layer; filling a second buffer layer in the upper portion of the trench and over the second diffusion barrier layer; and planarizing the first diffusion barrier layer, the first buffer layer, the second diffusion barrier layer, and the second buffer layer to form the first diffusion barrier, a first buffer, the second diffusion barrier, and a second buffer, respectively.

Each of the first diffusion barrier layer and the second diffusion barrier layer may include a diffusion-suppressing species. Each of the first diffusion barrier layer and the second diffusion barrier layer is formed of an undoped material, and after the performing of the planarization, the method may further include implanting the diffusion-suppressing species into the first diffusion barrier layer and the second diffusion barrier layer.

The forming of the gate layer may include: forming a polysilicon layer fill the recess; implanting the dopant into the polysilicon layer; and performing annealing to activate the dopant. The recess gate is a part of a sense amplifier of a memory cell.

In an embodiment, a semiconductor device may include: a semiconductor region including a recess and first doped regions on both sides of the recess; a second doped region filled in the recess; and a dielectric region laterally surrounding the semiconductor region, wherein the dielectric region includes a diffusion barrier that contacts both ends of the second doped region. The diffusion barrier may has a height at least the same the depth of the recess. The diffusion barrier may include a diffusion-suppressing species. The diffusion-suppressing species may include nitrogen, carbon, fluorine, boron, germanium or a combination thereof. The diffusion barrier may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof.

The second doped region may include a first dopant, and the diffusion barrier may include a second dopant that is different from the first dopant. The first dopant may include phosphorus, arsenic, boron, indium, or a combination thereof, and the second dopant may include nitrogen, carbon, fluorine, boron, germanium, or a combination thereof. The first doped region is a source/drain region of a transistor, and the second doped region is a gate electrode of the transistor.

The diffusion barrier may include: a first diffusion barrier contacting both ends of the second doped region and surrounding completely the semiconductor region; and a second diffusion barrier surrounding the first diffusion barrier. The first diffusion barrier may include a first diffusion-suppressing species, and the second diffusion barrier may include a second diffusion-suppressing species that is different from the first diffusion-suppressing species. The first diffusion-suppressing species may include nitrogen, carbon, fluorine, boron, germanium, or a combination thereof, and the second diffusion-suppressing species may include nitrogen, carbon, fluorine, boron, germanium, or a combination thereof.

The dielectric region may include: a first diffusion barrier contacting both ends of the second doped region and laterally surrounding the second doped region; and a buffer layer surrounding a lower portion of the first diffusion barrier; and a second diffusion barrier surrounding an upper portion of the first diffusion barrier on the buffer layer. The first diffusion barrier and the second diffusion barrier may include first and second diffusion-suppressing species, respectively, and the buffer layer does not include the diffusion-suppressing species.

Each of the first and the second diffusion-suppressing species may include nitrogen, carbon, fluorine, boron, germanium, or a combination thereof. Each of the first diffusion barrier and the second diffusion barrier may include a silicon nitride, a silicon oxynitride, a boron-doped nitride, a carbon-doped nitride, a nitrogen-doped oxide, a fluorine-doped oxide, a germanium-doped oxide, a carbon layer, or a combination thereof. Each of the first diffusion barrier and the second diffusion barrier may include a doped oxide, and the buffer layer may includes an undoped oxide, and the doped oxide is oxide doped with nitrogen, fluorine, germanium, or a combination thereof.

Each of the first diffusion barrier and the second diffusion barrier may include nitride, and the buffer layer may include undoped oxide. Each of the first diffusion barrier and the second diffusion barrier may include a doped nitride, the buffer layer may include undoped oxide, and the doped nitride is nitride doped with boron, carbon, or a combination thereof.

In an embodiment, a semiconductor device may include: a first active region including a first recess; a second active region including a second recess; a first recess gate filled in the first recess; a second recess gate filled in the second recess; and an isolation region surrounds the first active region and the second active region, wherein the isolation region including a first stress-inducing layer surrounding a sidewall of the first active region and a second stress-inducing layer surrounding a sidewall of the second active region. The first stress-inducing layer has a tensile stress, and the second stress-inducing layer has a compressive stress. The first recess gate is a gate electrode of an NMOS-FET, and the second recess gate is a gate electrode of a PMOSFET.

The first recess gate may include N-type doped polysilicon, and the second recess gate may include P-type doped polysilicon. The semiconductor device may include a sense amplifier, and the sense amplifier may include the first recess gate and the second recess gate. The first stress-inducing layer and the second stress-inducing layer have heights and widths that cover both ends of the first recess gate and both ends of the second recess gate, respectively. The first stress-inducing layer and the second stress-inducing layer completely surround the sidewall of the first active region and the sidewall of the second active region, respectively. The first stress-inducing layer partially surrounds the sidewall of first active region, and the second stress-inducing layer partially surrounds the sidewall of the second active region.

DETAILED DESCRIPTION

Figure 1:
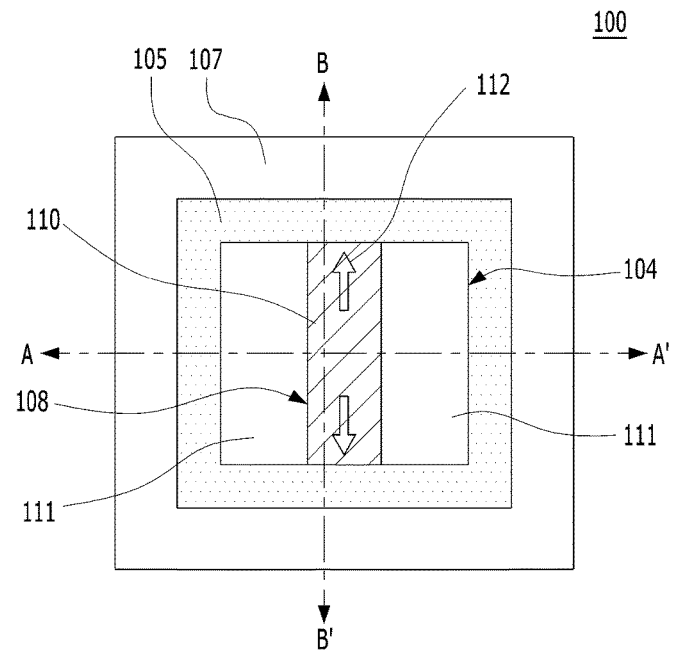
FIG. 1 is a plan view illustrating a semiconductor device in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Figure 2A:
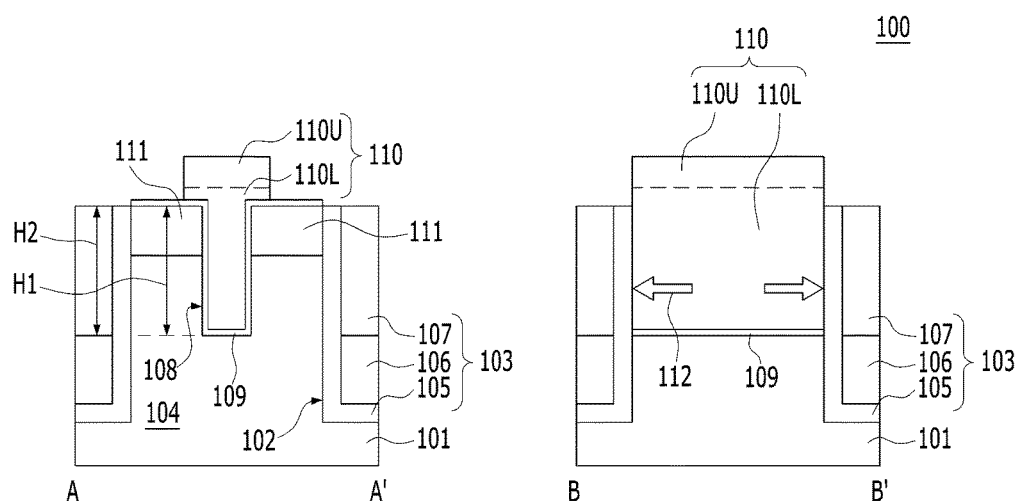
FIG. 2A illustrates cross-sectional views taken along the lines A-A' and B-B' of FIG. 1.

FIG. 1 is a plan view illustrating a semiconductor device in accordance with a first embodiment. FIG. 2A illustrates cross-sectional views taken along the lines A-A' and B-B' of FIG. 1.

Referring to FIGS. 1 and 2A, a semiconductor device 100 may include a substrate 101, and a semiconductor region 104 and a dielectric region 103 may be formed in the substrate 101. The dielectric region 103 may be formed in a trench 102. The semiconductor region 104 may include a recess 108 and first doped regions 111. A dielectric layer 109 may be formed on the bottom and sidewalls of the recess 108. The first doped regions 111 may be formed in the semiconductor region 104 on both sides of the recess 108. A second doped region 110 may be formed in the recess 108.

The semiconductor region 104, the first doped region 111 and the second doped region 110 may include dopants, respectively. The semiconductor region 104, the first doped region 111 and the second doped region 110 may include the same dopant as each other or different dopants from each other. A dopant may include an N-type dopant or a P-type dopant. The N-type dopant may include phosphorus or arsenic. The P-type dopant may include boron or indium. The semiconductor region 104, the first doped region 111 and the second doped region 110 may be silicon-base materials, respectively. The second doped region 110 may include polysilicon, and the first doped region 111 and the semiconductor region 104 may include monocrystalline silicon. The second doped region 110 may include N-type doped polysilicon or P-type doped polysilicon. The second doped region 110 may include a first portion 110L and a second portion 110U. The first portion 110L and the second portion 110U may include the same dopant. The first portion 110L and the second portion 110U may have different doping concentrations.

The semiconductor region 104 may have an island shape due to the presence of the dielectric region 103. The dielectric region 103 may be a shallow trench isolation (STI) region. The dielectric region 103 may have a shape that surrounds the semiconductor region 104. The dielectric region 103 may have a shape that laterally surrounds the semiconductor region 104. The dielectric region 103 may include a diffusion barrier. The dielectric region 103 may include a first diffusion barrier 105 and a second diffusion barrier 107. The first diffusion barrier 105 may laterally surround the semiconductor region 104. The second diffusion barrier 107 may surround the first diffusion barrier 105.

The dielectric region 103 may further include a buffer layer 106. The buffer layer 106 may play the role of buffering stresses between the first diffusion barrier 105 and the second diffusion barrier 107. The buffer layer 106 may surround the lower portion of the first diffusion barrier 105. The second diffusion barrier 107 may surround the upper portion of the first diffusion barrier 105 and is located on the buffer layer 106.

The trench 102 may be covered with the first diffusion barrier 105. The covered trench 102 may be filled with the buffer layer 106 and the second diffusion barrier 107. A depth H1 of the recess 108 and a height H2 of the second diffusion barrier 107 may be substantially the same as each other. In another embodiment, the bottom surface of the second diffusion barrier 107 may be located at a level lower than the bottom surface of the recess 108.

The first diffusion barrier 105, the buffer layer 106 and the second diffusion barrier 107 may include dielectric materials. The first diffusion barrier 105 and the second diffusion barrier 107 may include diffusion-suppressing species. The buffer layer 106 may not contain a diffusion-suppressing species. The first diffusion barrier 105 and the second diffusion barrier 107 may be doped materials, and the buffer layer 106 may be an undoped material. The first diffusion barrier 105 and the second diffusion barrier 107 may be materials that are doped with diffusion-suppressing species. The buffer layer 106 may be a material that is not doped with a diffusion-suppressing species.

The first diffusion barrier 105 may be a doped material that is doped with a first diffusion-suppressing species. The first diffusion-suppressing species may include nitrogen, carbon, fluorine, boron, germanium or a combination thereof. The first diffusion barrier 105 may be a doped oxide that includes the first diffusion-suppressing species, and the buffer layer 106 may be an undoped oxide that is not doped with the first diffusion-suppressing species. The first diffusion barrier 105 may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof.

The second diffusion barrier 107 may be a material that is different from the buffer layer 106. The second diffusion barrier 107 may include a second diffusion-suppressing species. The second diffusion-suppressing species may include nitrogen, carbon, fluorine, boron, germanium or a combination thereof. The second diffusion barrier 107 may be a doped oxide that includes the second diffusion-suppressing species, and the buffer layer 106 may be an undoped oxide that is not doped with the second diffusion-suppressing species. The second diffusion barrier 107 may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof.

The first diffusion barrier 105 and the second diffusion barrier 107 may be the same material or different materials. The first diffusion barrier 105 and the second diffusion barrier 107 may include the same diffusion-suppressing species or different diffusion-suppressing species. In the case of including different diffusion-suppressing species, the first diffusion barrier 105 may be a nitrogen-containing material, and the second diffusion barrier 107 may be a material that contains fluorine, germanium or carbon. The nitrogen-containing material may be a silicon nitride, a silicon oxynitride, a boron-doped nitride or a nitrogen-doped oxide.

The buffer layer 106 may include a silicon oxide. The buffer layer 106 may be an undoped silicon oxide.

According to the above descriptions, in the first embodiment, the dielectric region 103 may include the first diffusion barrier 105 and the second diffusion barrier 107. By the first diffusion barrier 105 and the second diffusion barrier 107, out-diffusion 112 of a dopant from the second doped region 110 may be prevented. The first diffusion barrier 105 and the second diffusion barrier 107 may prevent lateral diffusion of a dopant from the second doped region 110.

The second diffusion barrier 107 may have a height at least the same as the depth of the recess 108. In this way, since the second diffusion barrier 107 has the same height as the depth of the recess 108, out-diffusion 112 of a dopant may be prevented even though the first diffusion barrier 105 is lost.

Figure 2B:
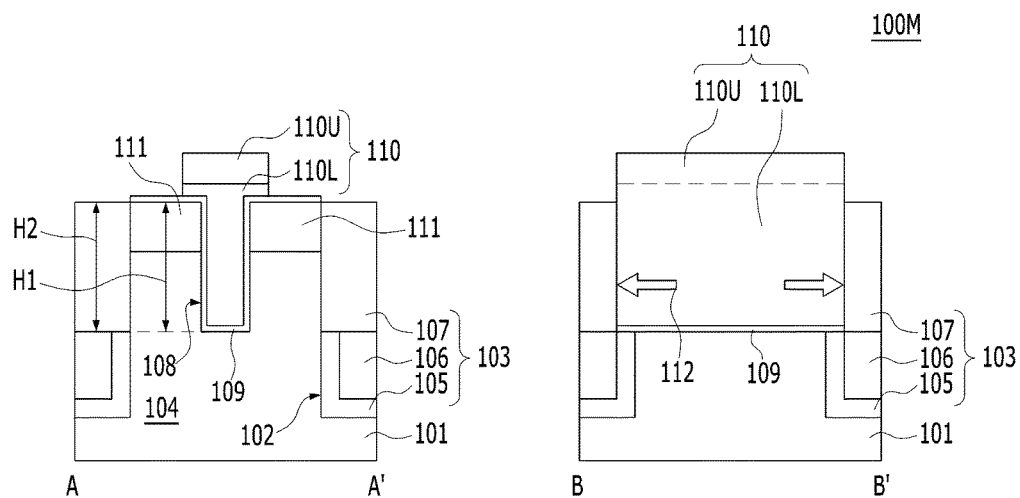
FIG. 2B illustrates modified cross-sectional views taken in correspondence to the lines A-A' and B-B' of FIG. 1.

FIG. 2B illustrates modified cross-sectional views taken the lines A-A' and B-B' of FIG. 1.

Referring to FIG. 2B, the second doped region 110 and the second diffusion barrier 107 may directly contact each other. Since the second diffusion barrier 107 has the same height as the depth of the recess 108, out-diffusion 112 of a dopant may be prevented even without the first diffusion barrier 105. To prevent out-diffusion 112 of a dopant to the buffer layer 106, the first diffusion barrier 105 surrounds a lower portion of the second diffusion barrier 107 and is located at a level lower than the bottom surface of the recess 108.

The above-described first embodiment and the modification thereof may be applied to a transistor. For example, the second doped region 110 may be a recess gate including a dopant.

Figure 3:
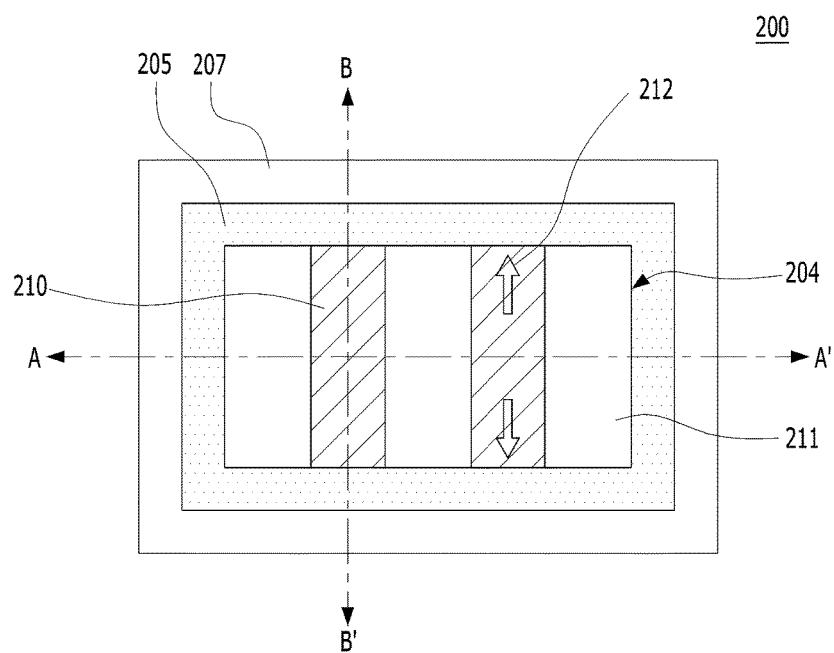
FIG. 3 is a plan view illustrating a semiconductor device in accordance with a second embodiment.
Figure 4:
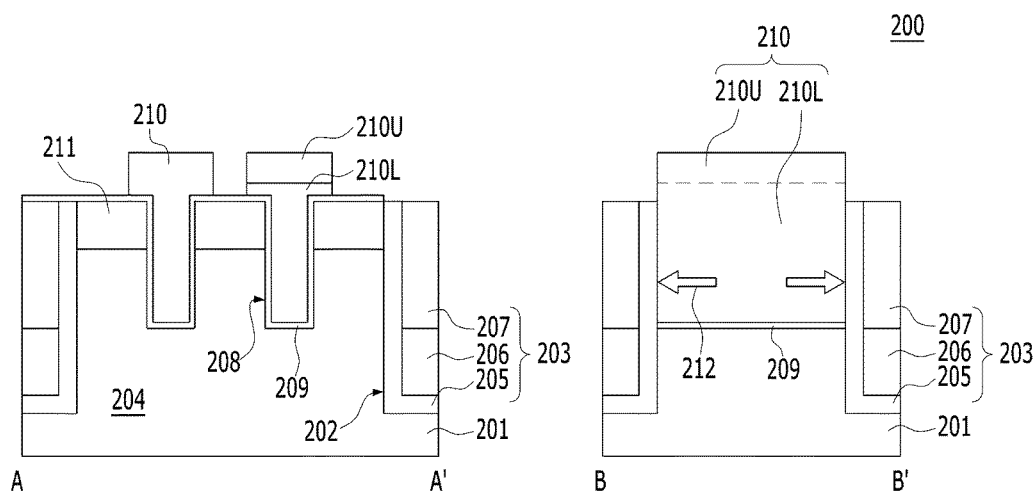
FIG. 4 illustrates cross-sectional views taken along the lines A-A' and B-B' of FIG. 3.

FIG. 3 is a plan view illustrating a semiconductor device in accordance with a second embodiment. FIG. 4 illustrates cross-sectional views taken along the lines A-A' and B-B' of FIG. 3. A semiconductor device 200, for example, a transistor, is shown.

Referring to FIGS. 3 and 4, the semiconductor device 200 may include a substrate 201, and an active region 204 and a non-active region 203 may be formed in the substrate 201. Hereafter, the non-active region 203 may be referred to as an isolation region 203. The isolation region 203 may be formed in a trench 202. The isolation region 203 may be a STI region. The isolation region 203 may include a first diffusion barrier 205, a buffer layer 206, and a second diffusion barrier 207. The trench 202 may be covered with the first diffusion barrier 205. The covered trench 202 may be filled with the buffer layer 206 and the second diffusion barrier 207.

One or more gate recesses 208 may be formed in the active region 204. A gate dielectric layer 209 may be formed on the bottoms and sidewalls of the gate recesses 208. Recess gates 210 may be formed in the gate recesses 208. Each recess gate 210 may include a first portion 210L and a second portion 210U. Doping regions 211 may be formed in the active region 204 on both sides of each recess gate 210. The recess gate 210 may include N-type doped polysilicon or P-type doped polysilicon.

The active region 204 may have an island shape due to the presence of the isolation region 203. The first diffusion barrier 205 and the second diffusion barrier 207 of the isolation region 203 may have shapes that surround the active region 204, respectively. The first diffusion barrier 205 and the second diffusion barrier 207 may laterally surround the active region 204.

The first diffusion barrier 205, the buffer layer 206 and the second diffusion barrier 207 may include dielectric materials. The first diffusion barrier 205 and the second diffusion barrier 207 may include diffusion-suppressing species. The first diffusion barrier 205 and the second diffusion barrier 207 may be doped materials, and the buffer layer 206 may be an undoped material.

The first diffusion barrier 205 may be a material that is doped with a diffusion-suppressing species or a material that contains a diffusion-suppressing species, and the buffer layer 206 may be a material that is not doped with or does not contain a diffusion-suppressing species. The first diffusion barrier 205 may be a doped oxide that is doped with a diffusion-suppressing species, and the buffer layer 206 may be an undoped oxide that is not doped with a diffusion-suppressing species. The diffusion-suppressing species may include nitrogen, carbon, fluorine, boron, germanium or a combination thereof. For example, the first diffusion barrier 205 may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof.

The second diffusion barrier 207 may be a material that is different from the buffer layer 206. The second diffusion barrier 207 may include a diffusion-suppressing species. The second diffusion barrier 207 may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof. The first diffusion barrier 205 and the second diffusion barrier 207 may be the same material or different materials. The first diffusion barrier 205 and the second diffusion barrier 207 may include the same diffusion-suppressing species or different diffusion-suppressing species. In the case of including different diffusion-suppressing species, the first diffusion barrier 205 may be a nitrogen-containing material, and the second diffusion barrier 207 may be a material that contains fluorine, germanium or carbon. The nitrogen-containing material may be a silicon nitride, a silicon oxynitride, a boron-doped nitride or a nitrogen-doped oxide.

The buffer layer 206 may include a silicon oxide. The buffer layer 206 may be an undoped silicon oxide.

According to the above descriptions, in the second embodiment, the isolation region 203 may include the first diffusion barrier 205 and the second diffusion barrier 207. Out-diffusion 212 of a dopant from the recess gate 210 may be prevented by the first diffusion barrier 205 and the second diffusion barrier 207. The first diffusion barrier 205 may prevent lateral diffusion of a dopant.

FIGS. 5A to 5I are cross-sectional views illustrating a method for manufacturing the semiconductor device in accordance with the second embodiment.

Figure 5A:
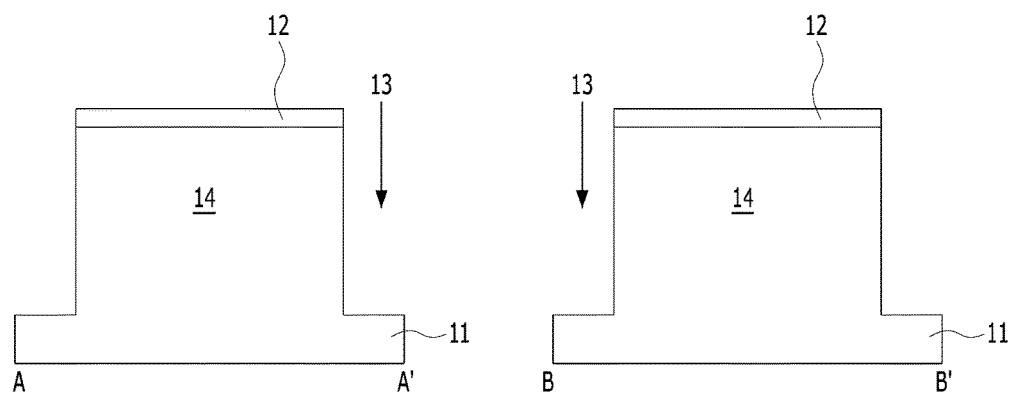
FIGS. 5A to 5I are cross-sectional views illustrating a method for manufacturing the semiconductor device in accordance with the second embodiment.

As shown in FIG. 5A, a trench 13 may be formed. At least one trench 13 may be formed in a substrate 11. An active region 14 may be defined by the trench 13. In order to form the trench 13, a hard mask layer 12 may be formed on the substrate 11. The hard mask layer 12 may include an opening. The opening may define a region where the trench 13 will be disposed. The substrate 11 may include a semiconductor substrate. The substrate 11 may be a material that contains silicon, that is, a silicon-base material. The substrate 11 may be a silicon substrate, a silicon germanium substrate or a silicon-on-insulator (SOI) substrate. The hard mask layer 12 may include a material that has an etching selectivity with respect to the substrate 11. The hard mask layer 12 may include an oxide, a nitride or a combination thereof. For example, the hard mask layer 12 may include a silicon nitride.

Figure 5B:
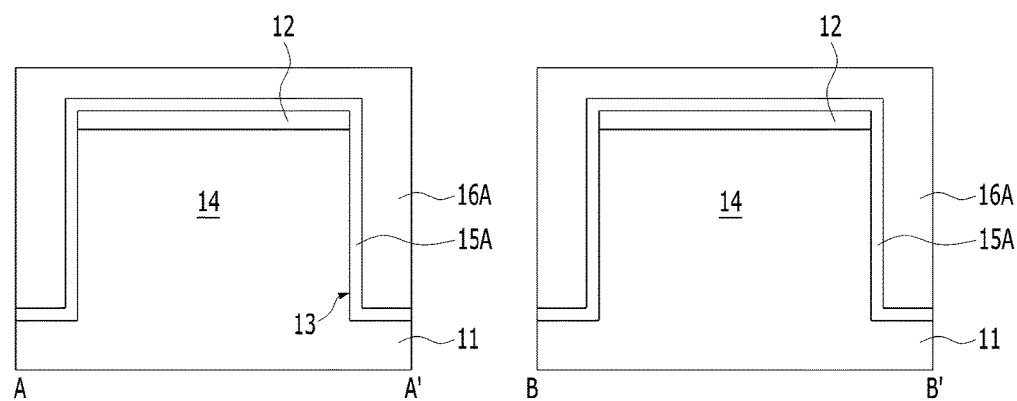

As shown in FIG. 5B, a first diffusion barrier layer 15A may be formed. A buffer layer 16A may be formed on the first diffusion barrier layer 15A. The first diffusion barrier layer 15A may be formed conformally on the trench 13. The first diffusion barrier layer 15A may line the bottom and sidewalls of the trench 13. The trench 13 that is lined with the first diffusion barrier layer 15A, that is, the lined trench 13 may be filled with the buffer layer 16A. The first diffusion barrier layer 15A may be a material capable of preventing diffusion of a dopant from a subsequent gate layer.

The first diffusion barrier layer 15A may be referred to as a dopant diffusion barrier layer. The first diffusion barrier layer 15A may include a dielectric material. The first diffusion barrier layer 15A may include a diffusion-suppressing species. The first diffusion barrier layer 15A may be a doped material, and the buffer layer 16A may be an undoped material. The first diffusion barrier layer 15A may be a material that is doped with a diffusion-suppressing species or a material that contains a diffusion-suppressing species, and the buffer layer 16A may be a material that is not doped with or does not contain a diffusion-suppressing species. The first diffusion barrier layer 15A may be a doped oxide that is doped with a diffusion-suppressing species, and the buffer layer 16A may be an undoped oxide that is not doped with a diffusion-suppressing species.

The diffusion-suppressing species may include nitrogen, carbon, fluorine, boron, germanium or a combination thereof. For example, the first diffusion barrier layer 15A may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof. The buffer layer 16A may include a silicon oxide.

Figure 5C:
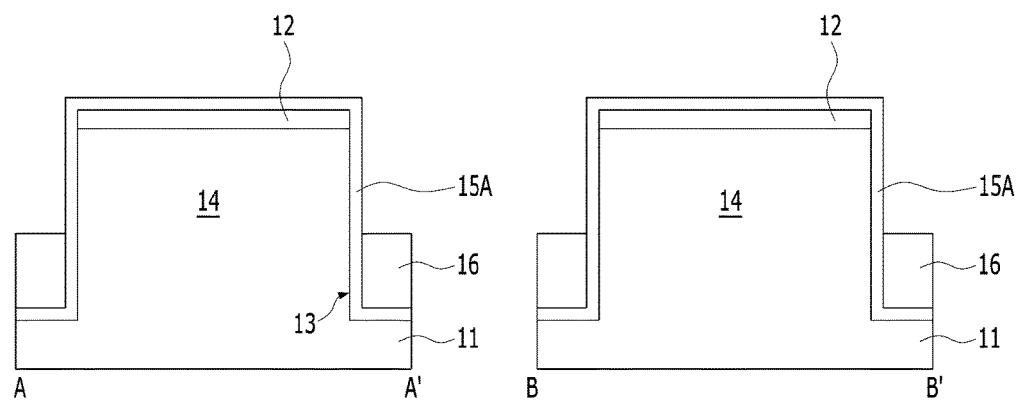

As shown in FIG. 5C, the buffer layer 16A may be recessed. As a result, a buffer pattern 16 is formed. A top surface of the buffer pattern 16 is located at a level lower than the top surface of the active region 14. An upper portion of the first diffusion barrier layer 15A may be exposed by the buffer pattern 16.

Figure 5D:
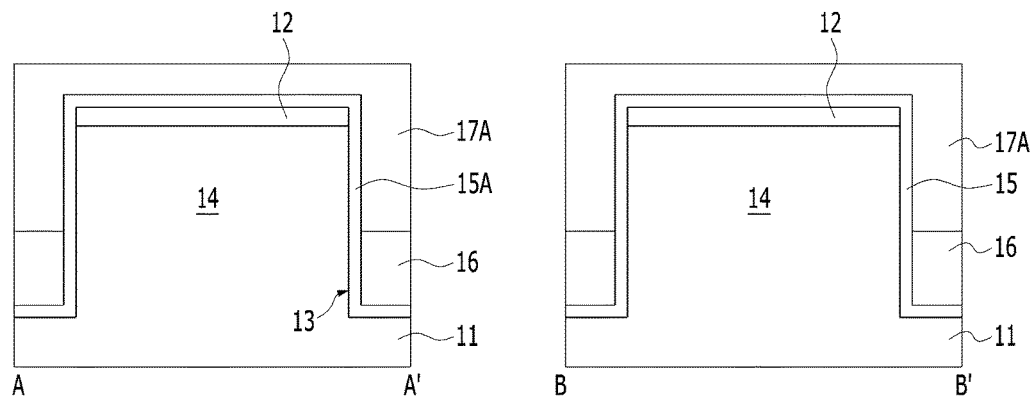

As shown in FIG. 5D, a second diffusion barrier layer 17A may be formed. The second diffusion barrier layer 17A may be formed on the buffer pattern 16 and the first diffusion barrier layer 15A. The second diffusion barrier layer 17A may fill the trench 13, be located on the buffer pattern 16, and cover the exposed portion of the first diffusion barrier layer 15A. The second diffusion barrier layer 17A may be a material capable of preventing diffusion of the dopant from the subsequent gate layer. The second diffusion barrier layer 17A may be referred to as a dopant diffusion barrier layer.

The second diffusion barrier layer 17A may include a dielectric material. The second diffusion barrier layer 17A may be a material that is different from the buffer pattern 16. The second diffusion barrier layer 17A may include a diffusion-suppressing species. The second diffusion barrier layer 17A may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof. The first diffusion barrier layer 15A and the second diffusion barrier layer 17A may be the same material or different materials. The first diffusion barrier layer 15A and the second diffusion barrier layer 17A may include the same diffusion-suppressing species or different diffusion-suppressing species. In the case of including different diffusion-suppressing species, the first diffusion barrier layer 15A may be a nitrogen-containing material, and the second diffusion barrier layer 17A may be a material that contains fluorine, germanium or carbon. The nitrogen-containing material may be a silicon nitride, a silicon oxynitride, a boron-doped nitride or a nitrogen-doped oxide.

Figure 5E:
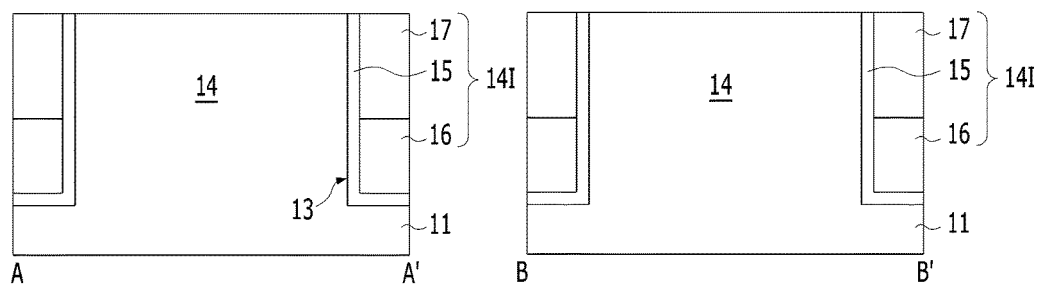

As shown in FIG. 5E, a first diffusion barrier 15 and a second diffusion barrier 17 may be formed. The second diffusion barrier 17 may be formed by etching of the second diffusion barrier layer 17A. The first diffusion barrier 15 may be formed by etching of the first diffusion barrier layer 15A. The first diffusion barrier layer 15A and the second diffusion barrier layer 17A may be exposed to a planarization process, and accordingly, the first diffusion barrier layer 15A and the second diffusion barrier layer 17A may remain in the trench 13. The remaining first diffusion barrier layer 15A may be referred to as the first diffusion barrier 15, and the remaining second diffusion barrier layer 17A may be referred to as the second diffusion barrier 17.

Subsequently, the hard mask layer 12 may be stripped. After stripping the hard mask layer 12, heights of the first diffusion barrier 15 and the second diffusion barrier 17 may be adjusted to be at the same level as the top surface of the active region 14. In the case in which the first and second diffusion barriers 15 and 17 and the hard mask layer 12 are nitrides, the heights of the first and second diffusion barriers 15 and 17 may be adjusted when the hard mask layer 12 is removed.

In this way, an isolation region 141 that includes the first diffusion barrier 15, the buffer pattern 16 and the second diffusion barrier 17 may be formed in the trench 13. The sidewalls and bottom of the trench 13 may be covered with the first diffusion barrier 15. The trench 13 that is covered with the first diffusion barrier 15, that is, the covered trench 13 may be filled with the buffer pattern 16 and the second diffusion barrier 17. The first diffusion barrier 15 and the second diffusion barrier 17 may not be formed on the top surface of the active region 14. The height of the second diffusion barrier 17 may be at least the same as a height of subsequent gate recesses. That is, the second diffusion barrier 17 may be the same depth as the gate recesses or may extend deeper than the gate recesses.

Figure 5F:
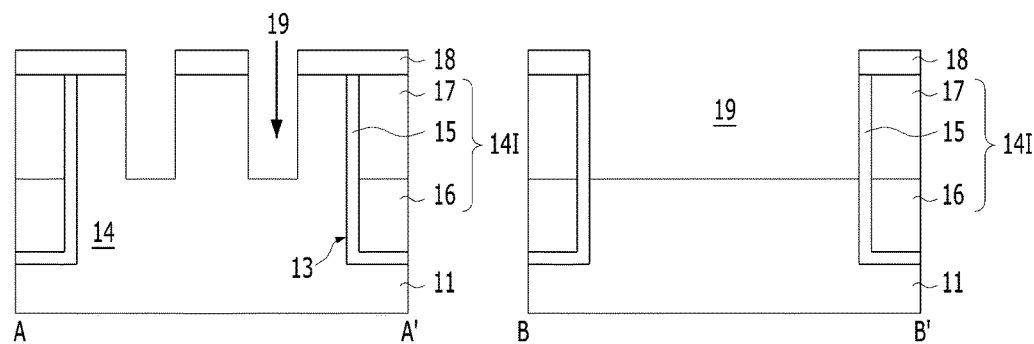

As shown in FIG. 5F, gate recesses 19 may be formed. The gate recesses 19 may be referred to as gate trenches. In order to form the gate recesses 19, the active region 14 may be selectively etched using a mask layer 18. The gate recesses 19 may be a line shape that traverses the active region 14. A depth of the gate recesses 19 may be the same as or shallower than the height of the second diffusion barrier 17. The gate recesses 19 may not be formed in the second diffusion barrier 17 and the buffer pattern 16. That is, the gate recesses 19 may be formed selectively in only the active region 14.

In another embodiment, during etching for forming the gate recesses 19, a portion of the first diffusion barrier 15 may be unintentionally etched or damaged. Even then, the buffer pattern 16 is not exposed due to the presence of the second diffusion barrier 17.

Figure 5G:
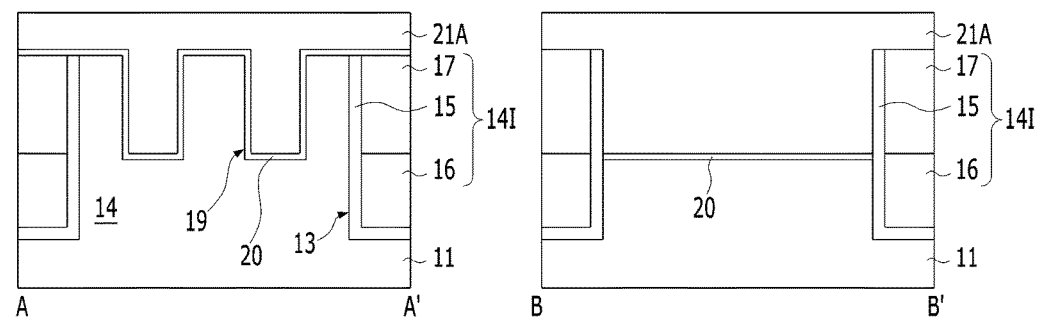

As shown in FIG. 5G, the mask layer 18 may be removed. Next, a gate dielectric layer 20 may be formed. The gate dielectric layer 20 may be formed by oxidizing the top surface of the active region 14 and the surfaces of the gate recesses 19. In another embodiment, the gate dielectric layer 20 may be formed by chemical vapor deposition.

A gate layer 21A may be formed on the gate dielectric layer 20. The gate layer 21A may include polysilicon, a metal or a combination thereof. The gate layer 21A may include undoped polysilicon that is not doped with a dopant. The gate layer 21A may include lightly doped polysilicon that is doped in situ to a low concentration. In order to form the doped polysilicon that is doped in situ, a dopant may be doped in situ when depositing polysilicon. In another embodiment, the gate layer 21A may include doped polysilicon that is implanted with a dopant. In order to form the doped polysilicon that is implanted, a dopant may be implanted after depositing undoped polysilicon. The gate layer 21A may include N-type doped polysilicon or P-type doped polysilicon. The gate layer 21A may fill the gate recesses 19, and cover the tops of the active region 14 and the second diffusion barrier 17. In order to fill the gate recesses 19 without a void, the gate layer 21A may be formed by chemical vapor deposition.

Figure 5H:
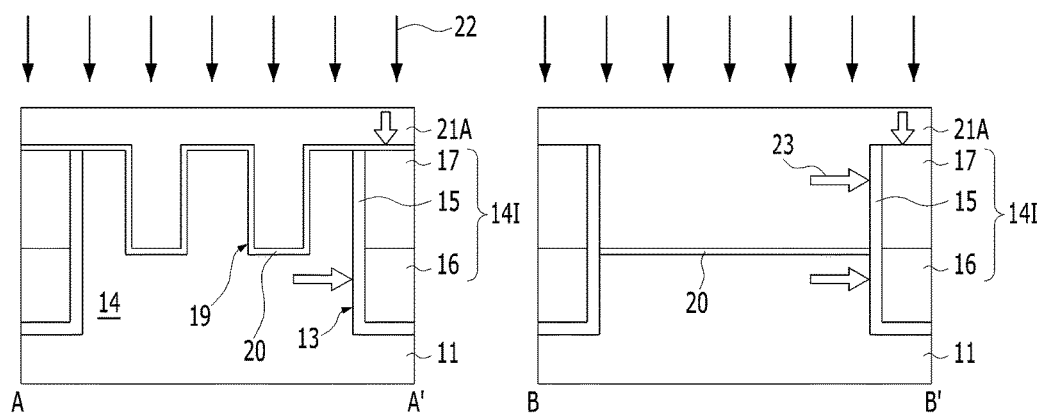

As shown in FIG. 5H, a thermal process 22 may be performed. The thermal process 22 may activate a dopant that is contained in the gate layer 21A. The thermal process 22 may include rapid thermal anneal (RTA).

Out-diffusion 23 of the dopant may occur during the thermal process 22. In the present embodiment, the first diffusion barrier 15 and the second diffusion barrier 17 may prevent out-diffusion 23 of the dopant from the gate layer 21A. Namely, an out-diffusion path of the dopant may be blocked by the first diffusion barrier 15 and the second diffusion barrier 17. Thus, dopant loss of the gate layer 21A may be prevented.

In this way, in the present embodiment, by preventing out-diffusion 23 of the dopant, gate depletion may be suppressed. Accordingly, the offset characteristic of transistors may be improved.

Further, in the present embodiment, by forming the first diffusion barrier 15, it is possible to prevent out-diffusion 23 of the dopant from the active region 14.

Figure 5I:
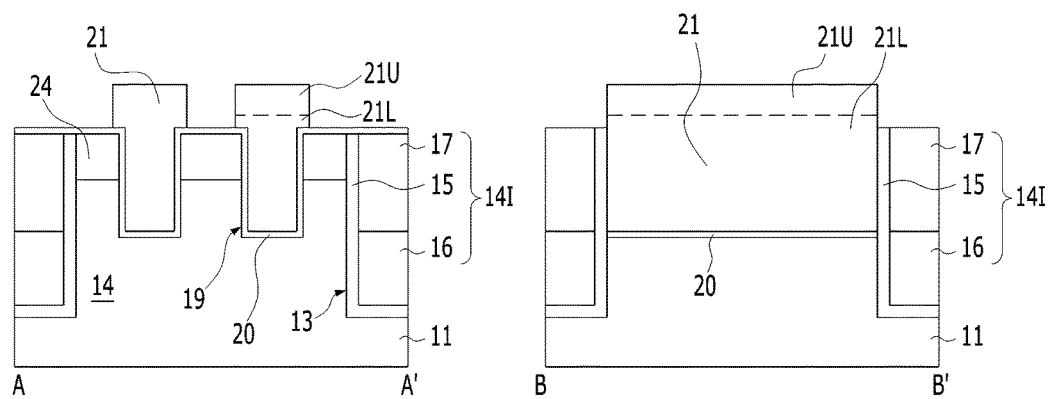

As shown in FIG. 5I, recess gates 21 may be formed. In order to form the recess gates 21, the gate layer 21A may be patterned. Each recess gate 21 may include a first portion 21L that fills each gate recess 19 and is extended to cover the active region 14 and a second portion 21U that is formed on the first portion 21L. The first portion 21L may be a T shape. In another embodiment, when each recess gate 21 is a stack structure of doped polysilicon and a metal, the first portion 21L may be the doped polysilicon, and the second portion 21U may be the metal.

Then, doping regions 24 may be formed. The doping regions 24 may be referred to as source/drain regions. The doping regions 24 may include an N-type dopant or a P-type dopant. A dopant may be doped by an implantation process.

Figure 6A:
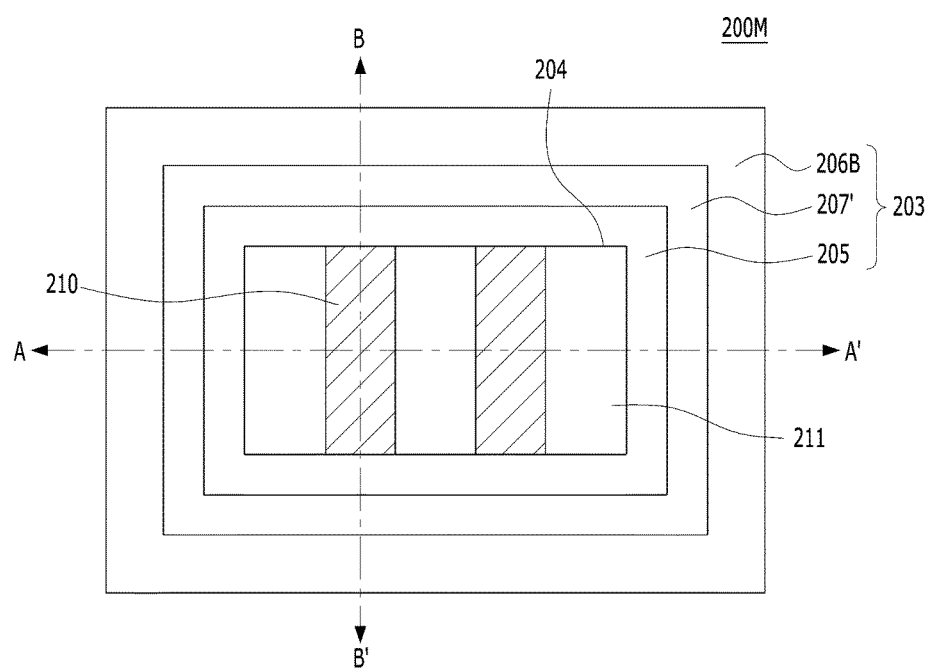
FIG. 6A is a plan view illustrating a semiconductor device in accordance with a modification of the second embodiment.
Figure 6B:
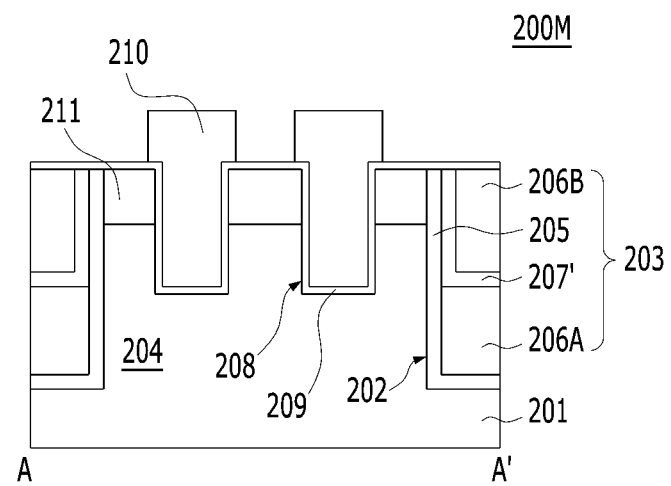
FIG. 6B illustrates cross-sectional views taken along the lines A-A' and B-B' of FIG. 6A.
Figure 6B:
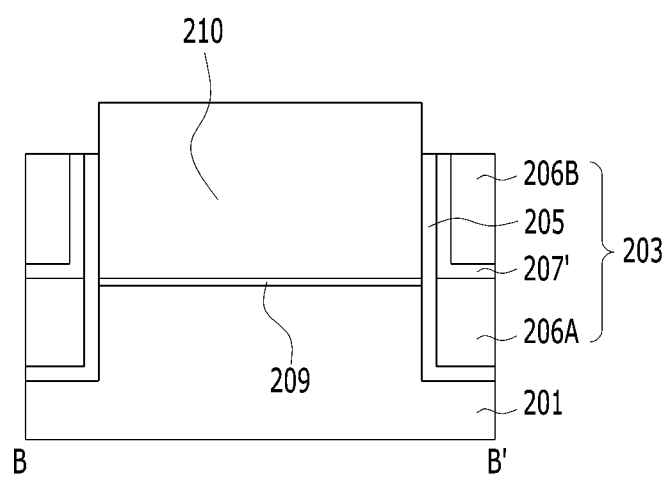

FIG. 6A is a plan view illustrating a semiconductor device 200M in accordance with a modification of the second embodiment. FIG. 6B shows cross-sectional views taken along the lines A-A' and B-B' of FIG. 6A. The semiconductor device 200M may include transistors. The semiconductor device 200M may be similar to the semiconductor device 200 according to the second embodiment.

Referring to FIGS. 6A and 6B, an isolation region 203 may include a first diffusion barrier 205, a first buffer layer 206A, a second diffusion barrier 207' and a second buffer layer 206B. The isolation region 203 may be filled in a trench 202. The trench 202 may be covered with the first diffusion barrier 205. The covered trench 202 may be partially filled with the first buffer layer 206A. The second diffusion barrier 207' may be lined on the first buffer layer 206A, and the second buffer layer 206B may be formed on the second diffusion barrier 207'.

An active region 204 may have an island shape due to the presence of the isolation region 203. The first diffusion barrier 205 and the second diffusion barrier 207' of the isolation region 203 may have shapes that surround the active region 204. The second diffusion barrier 207' may be thinner than the second diffusion barrier 207 of the second embodiment. Accordingly, a volume occupied by the second diffusion barrier 207' in the isolation region 203 may decrease.

Each of the first diffusion barrier 205 and the second diffusion barrier 207' may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof. The first diffusion barrier 205 and the second diffusion barrier 207' may be the same material or different materials. The first diffusion barrier 205 and the second diffusion barrier 207' may include the same diffusion-suppressing species or different diffusion-suppressing species. In the case of including different diffusion-suppressing species, the first diffusion barrier 205 may be a nitrogen-containing material, and the second diffusion barrier 207' may be a material that contains fluorine, germanium or carbon. The nitrogen-containing material may be a silicon nitride, a silicon oxynitride, a boron-doped nitride or a nitrogen-doped oxide.

Each of the first buffer layer 206A and the second buffer layer 206B may include a silicon oxide. Each of the first buffer layer 206A and the second buffer layer 206B may be an undoped silicon oxide.

FIGS. 7A to 7D are cross-sectional views illustrating a method for manufacturing the semiconductor device in accordance with the modification of the second embodiment. The modification of the second embodiment may be implemented by processes similar to those of the second embodiment.

As shown in FIGS. 5A to 5C, a buffer layer 16 is formed in a trench 13 that is lined with a first diffusion barrier layer 15A. The buffer layer 16 will be referred to as a first buffer layer 16.

Figure 7A:
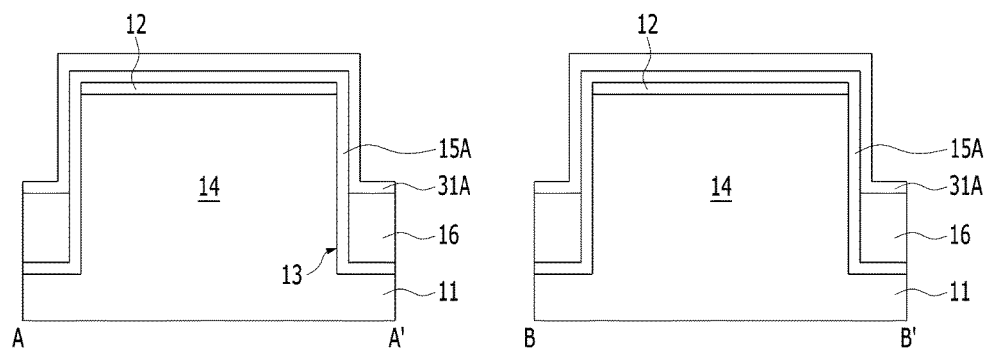
FIGS. 7A to 7D are cross-sectional views illustrating a method for manufacturing the semiconductor device in accordance with the modification of the second embodiment.

Next, as shown in FIG. 7A, a second diffusion barrier layer 31A may be formed. The second diffusion barrier layer 31A may be formed on the first buffer layer 16 and the first diffusion barrier layer 15A. The second diffusion barrier layer 31A may be formed conformally on the first buffer layer 16, and cover the exposed portion of the first diffusion barrier layer 15A. The second diffusion barrier layer 31A may not fill the trench 13. The second diffusion barrier layer 31A may be a material capable of preventing diffusion of a dopant from a subsequent gate layer. The second diffusion barrier layer 31A may be referred to as a dopant diffusion barrier layer.

The second diffusion barrier layer 31A may include a dielectric material. The second diffusion barrier layer 31A may be a material that is different from the first buffer layer 16. The second diffusion barrier layer 31A may include a diffusion-suppressing species. The second diffusion barrier layer 31A may include a silicon nitride, a silicon oxynitride, a boron-doped nitride, a carbon-doped nitride, a nitrogen-doped oxide, a fluorine-doped oxide, a germanium-doped oxide, a carbon layer or a combination thereof. The first diffusion barrier layer 15A and the second diffusion barrier layer 31A may be the same material or different materials. The first diffusion barrier layer 15A and the second diffusion barrier layer 31A may include the same diffusion-suppressing species or different diffusion-suppressing species. In the case of including different diffusion-suppressing species, the first diffusion barrier layer 15A may be a nitrogen-containing material, and the second diffusion barrier layer 31A may be a material that contains fluorine, germanium or carbon. The nitrogen-containing material may be a silicon nitride, a silicon oxynitride, a boron-doped nitride or a nitrogen-doped oxide.

Figure 7B:
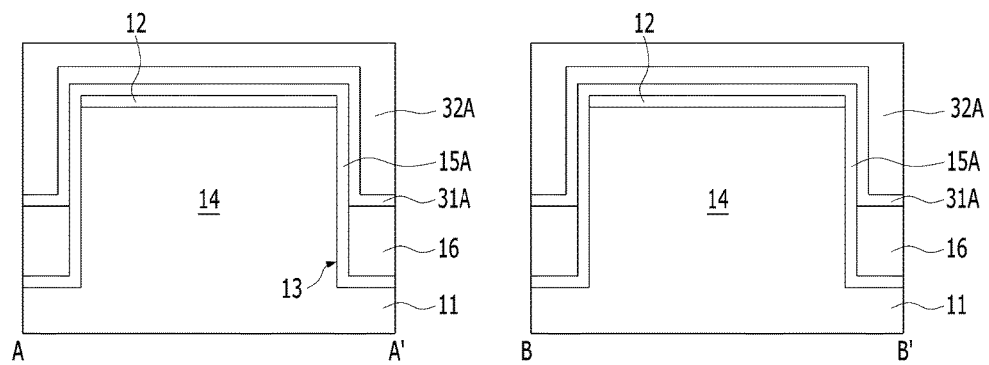

As shown in FIG. 7B, a second buffer layer 32A may be formed on the second diffusion barrier layer 31A. The second buffer layer 32A may fill the trench 13. The second buffer layer 32A may be a silicon oxide. The second buffer layer 32A may be an undoped silicon oxide.

Figure 7C:
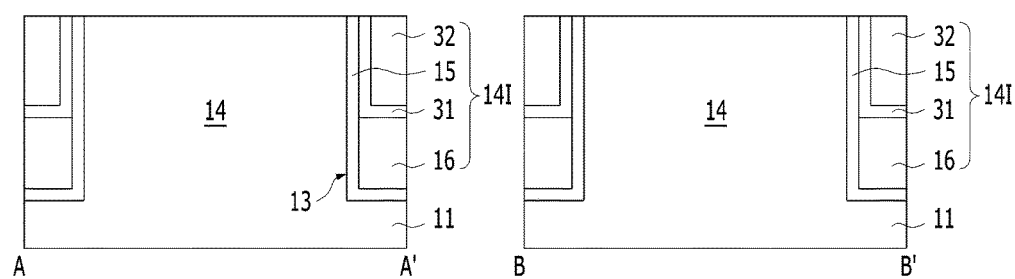

As shown in FIG. 7C, a first diffusion barrier 15 and a second diffusion barrier 31 may be formed. The second diffusion barrier 31 may be formed by etching of the second diffusion barrier layer 31A. The first diffusion barrier 15 may be formed by etching of the first diffusion barrier layer 15A. The first diffusion barrier layer 15A and the second diffusion barrier layer 31A may be exposed to a planarization process, and accordingly, the first diffusion barrier layer 15A and the second diffusion barrier layer 31A may remain in the trench 13.

The remaining first diffusion barrier layer 15A may be referred to as the first diffusion barrier 15, and the remaining second diffusion barrier layer 31A may be referred to as the second diffusion barrier 31. The second buffer layer 32A may be subject to the planarization process until a hard mask layer 12 is exposed. As a result, a second buffer layer 32 may be positioned in only the trench 13. Subsequently, the hard mask layer 12 may be stripped. After stripping the hard mask layer 12, heights of the first diffusion barrier 15 and the second diffusion barrier 31 may be at the same level as the top surface of the active region 14. In the case in which the first and second diffusion barriers 15 and 31 and the hard mask layer 12 are nitrides, the heights of the first and second diffusion barriers 15 and 31 may be adjusted when stripping the hard mask layer 12.

In this way, an isolation region 141 that includes the first diffusion barrier 15, the first buffer layer 16, the second diffusion barrier 31 and the second buffer layer 32 may be formed in the trench 13. The sidewalls and bottom of the trench 13 may be covered with the first diffusion barrier 15. The trench 13 that is covered with the first diffusion barrier 15, that is, the covered trench 13 may be filled with the first buffer layer 16, the second diffusion barrier 31 and the second buffer layer 32. The first diffusion barrier 15 and the second diffusion barrier 31 may not be formed on the top surface of the active region 14.

Figure 7D:
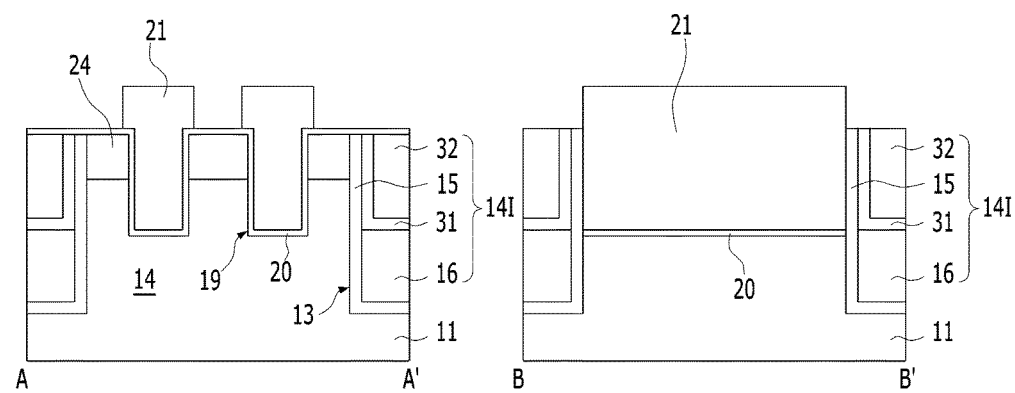

Subsequently, the series of processes shown in FIGS. 5G to 5I may be performed. As a result, as shown in FIG. 7D, gate recesses 19, a gate dielectric layer 20, recess gates 21 and doping regions 24 may be sequentially formed.

Figure 8A:
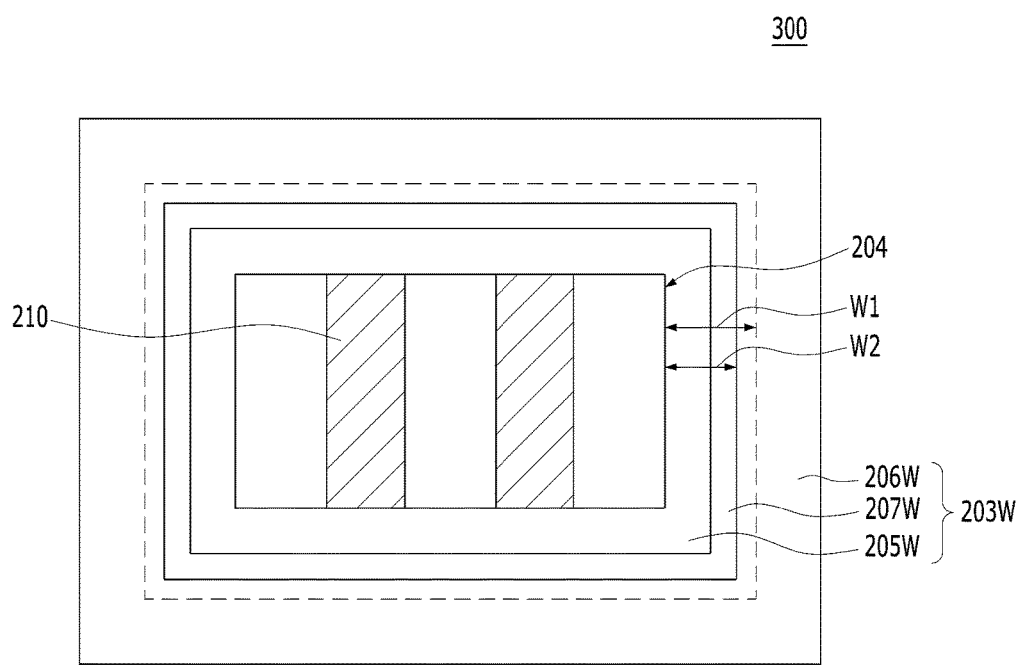
FIG. 8A is a plan view illustrating a semiconductor device in accordance with a third embodiment.

FIG. 8A is a plan view illustrating a semiconductor device 300 in accordance with a third embodiment. The semiconductor device 300 may include transistors.

Referring to FIG. 8A, the semiconductor device 300 in accordance with the third embodiment may include an active region 204 and an isolation region 203W. The isolation region 203W may include a first diffusion barrier 205W, a buffer layer 206W and a second diffusion barrier 207W. The isolation region 203W according to the third embodiment may be similar to the isolation region 203 according to the modification of the second embodiment. A width W2 of a diffusion barrier element of the isolation region 203W according to the third embodiment may be smaller than a width W1 of a diffusion barrier element of the isolation region 203 according to the modification of the second embodiment. Compare FIG. 8A with FIG. 6A. Namely, a volume occupied by the diffusion barrier element in the isolation region 203W may decrease. The first diffusion barrier 205W may have a width smaller than the first diffusion barrier 205 of the second embodiment. Also, the second diffusion barrier 207W may have a width smaller than the second diffusion barrier 207 of the second embodiment.

In this way, in order to decrease the widths of the first diffusion barrier 205W and the second diffusion barrier 207W, thicknesses of the first diffusion barrier 205W and the second diffusion barrier 207W may be reduced.

Figure 8B:
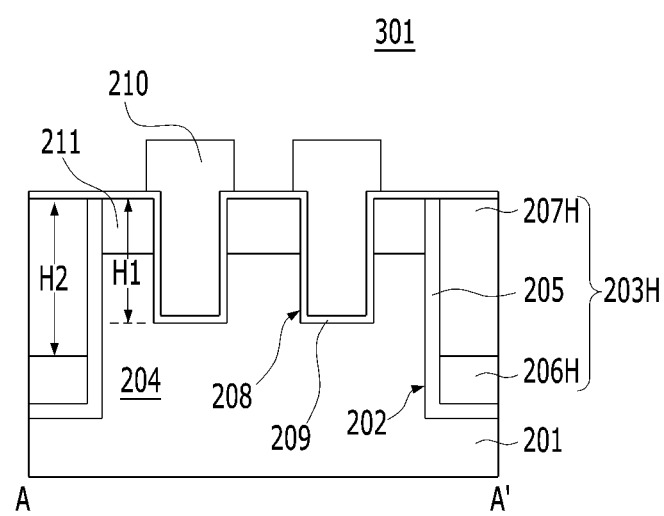
FIG. 8B illustrates cross-sectional views of a semiconductor device in accordance with a fourth embodiment.
Figure 8B:
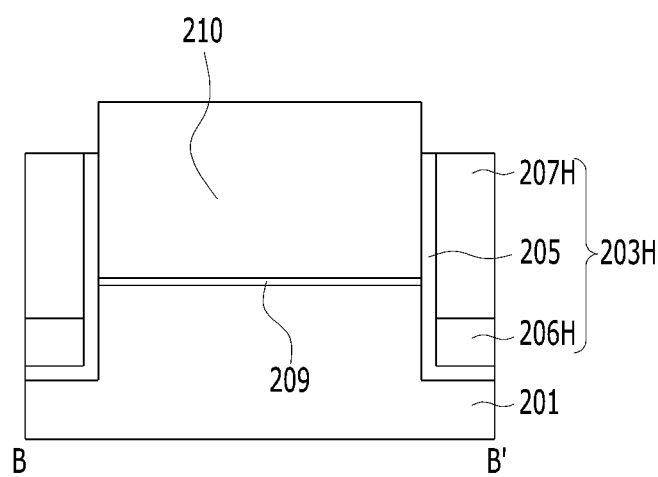

FIG. 8B illustrates cross-sectional views of a semiconductor device 301 in accordance with a fourth embodiment. Referring to FIG. 8B, the semiconductor device 301 in accordance with the fourth embodiment may include an active region 204 and an isolation region 203H. The isolation region 203H may include a first diffusion barrier 205, a buffer layer 206H and a second diffusion barrier 207H. The isolation region 203H according to the fourth embodiment may be similar to the isolation region 203 according to the second embodiment. A height H2 of the second diffusion barrier 207H of the isolation region 203H according to the fourth embodiment may be larger than a height H1 of the second diffusion barrier 207 of the isolation region 203 according to the second embodiment. That is, a volume occupied by the second diffusion barrier 207H in the isolation region 203H may increase.

To increase the height of the second diffusion barrier 207H, a recess amount of the buffer layer 206H may be increased. As described above, a volume of a diffusion barrier element is decreased as shown in the third embodiment, or a volume of a diffusion barrier element is increased as shown in the fourth embodiment.

By adjusting a width and a height of a diffusion barrier element, mobility may be boosted. According to a type and a manufacturing method of a nitride that is applied as a diffusion barrier, a compressive or tensile stress may be induced. Accordingly, by adjusting stresses applied to an active region and a recess gate, mobility may be increased.

Furthermore, distortion of silicon may be controlled. When a trench is gap-filled using only a nitride, a dislocation or a crack may occur in an active region due to an excessive compressive or tensile stress, whereby leakage current may be caused. In the embodiments of the present disclosure, by forming a buffer layer as a stress buffer, distortion of an active region may be prevented.

Figure 9A:
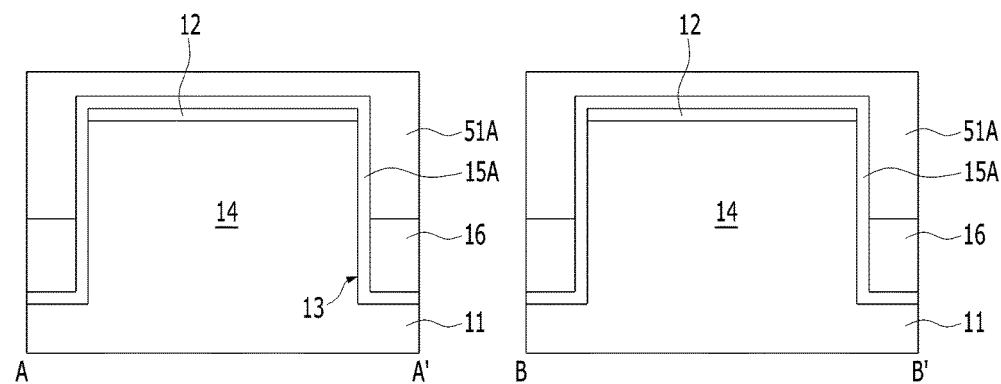
FIGS. 9A to 9C are cross-sectional views illustrating a method for manufacturing a semiconductor device in accordance with a fifth embodiment.
Figure 9B:
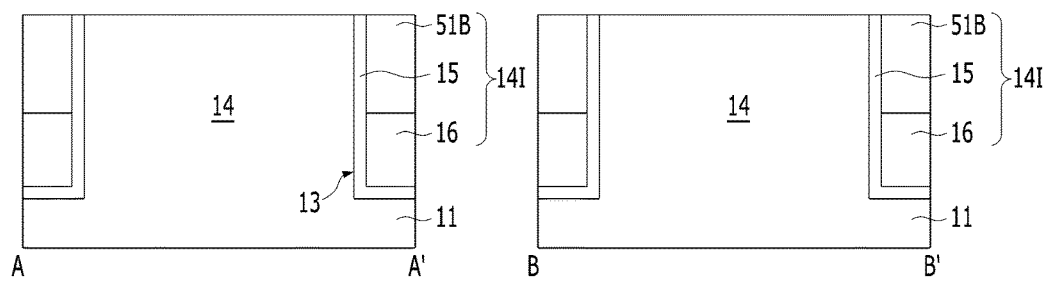
Figure 9C:
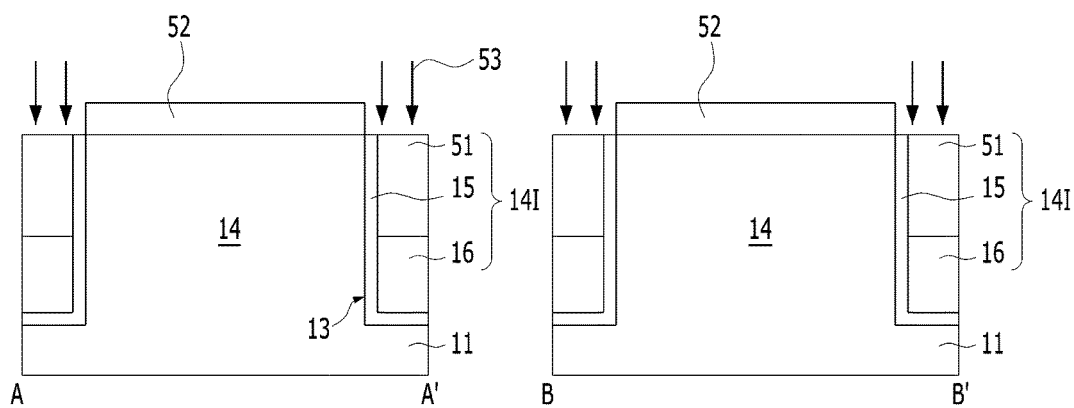

FIGS. 9A to 9C are cross-sectional views illustrating a method for manufacturing a semiconductor device in accordance with a fifth embodiment. First, as shown in FIGS. 5A to 5C, a buffer layer 16 is formed in a trench 13 that is lined with a first diffusion barrier layer 15A. Next, as shown in FIG. 9A, an undoped second diffusion barrier layer 51A may be formed. The undoped second diffusion barrier layer 51A may be formed on the buffer layer 16 and the first diffusion barrier layer 15A. The undoped second diffusion barrier layer 51A may fill the trench 13 on the buffer layer 16, and cover the exposed portion of the first diffusion barrier layer 15A.

The undoped second diffusion barrier layer 51A may include a dielectric material. The undoped second diffusion barrier layer 51A may be a material that is different from the buffer layer 16 and the first diffusion barrier layer 15A. The undoped second diffusion barrier layer 51A may not include a diffusion-suppressing species. The undoped second diffusion barrier layer 51A may include an undoped nitride, an undoped oxide or a combination thereof.

As shown in FIG. 9B, a first diffusion barrier 15 and an undoped second diffusion barrier 51B may be formed. The undoped second diffusion barrier 51B may be formed by etching of the undoped second diffusion barrier layer 51A. The first diffusion barrier 15 may be formed by etching of the first diffusion barrier layer 15A. The first diffusion barrier layer 15A and the undoped second diffusion barrier layer 51A may be exposed to a planarization process, and accordingly, the first diffusion barrier 15 and the undoped second diffusion barrier 51B may remain in the trench 13. Subsequently, a hard mask layer 12 may be stripped. After stripping the hard mask layer 12, a top surface of the first diffusion barrier 15 and a top surface of the undoped second diffusion barrier 51B may be at the same level as the top surface of an active region 14.

In this way, an isolation region 141 that includes the first diffusion barrier 15, the buffer layer 16 and the undoped second diffusion barrier 51B may be formed in the trench 13. The sidewalls and bottom of the trench 13 may be covered with the first diffusion barrier 15. The trench 13 that is covered with the first diffusion barrier 15, that is, the covered trench 13 may be filled with the buffer layer 16 and the undoped second diffusion barrier 51B. The first diffusion barrier 15 and the undoped second diffusion barrier 51B may not be formed on the top surface of the active region 14. The height of the undoped second diffusion barrier 51B may be at least the same as a height of subsequent gate recesses. That is, the undoped second diffusion barrier 51B may be the same depth as the gate recesses or may be deeper than the gate recesses.

As shown in FIG. 9C, a doping process 53 may be performed. The doping process 53 may be performed using a mask layer 52. The mask layer 52 may be formed to expose the undoped second diffusion barrier 51B and cover remaining regions.

A diffusion-suppressing species may be introduced by the doping process 53. The diffusion-suppressing species may be doped into the undoped second diffusion barrier 51B. Accordingly, a second diffusion barrier 51 may be formed. The diffusion-suppressing species may include nitrogen, carbon, fluorine, boron, germanium or a combination thereof. For example, the second diffusion barrier 51 may include a boron-doped nitride, a carbon-doped nitride, a nitrogen-doped oxide, a fluorine-doped oxide, a germanium-doped oxide or a combination thereof.

By such a doping process 53, both the first diffusion barrier 15 and the second diffusion barrier 51 may include diffusion-suppressing species. The first diffusion barrier 15 and the second diffusion barrier 51 may include the same diffusion-suppressing species or different diffusion-suppressing species. In the case of including different diffusion-suppressing species, the first diffusion barrier 15 may be a nitrogen-containing material, and the second diffusion barrier 51 may be a material that contains fluorine, germanium or carbon.

Subsequently, the series of processes shown in FIGS. 5G to 5I may be performed. That is, gate recesses 19, a gate dielectric layer 20, recess gates 21 and doping regions 24 may be sequentially formed.

Figure 10A:
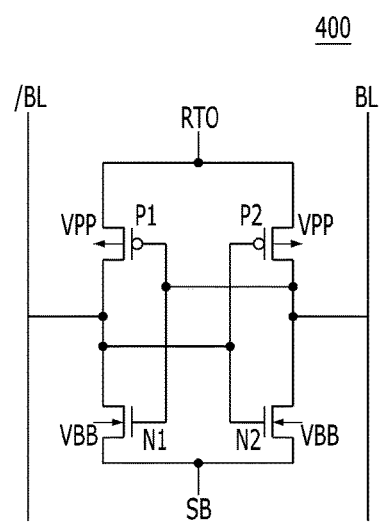
FIG. 10A is a diagram illustrating a sense amplifier of a memory cell according to an embodiment.

FIG. 10A is a diagram illustrating an application example of the embodiments of the present disclosure. FIG. 10A is a diagram illustrating a sense amplifier of a memory cell. Referring to FIG. 10A, a sense amplifier (S/A) 400 may include a pull-up element using a PMOS and a pull-down element using an NMOS. The sense amplifier 400 amplifies data voltages stored in a bit line BL and a bit line bar/BL and outputs the amplified data voltage to a data bus.

The sense amplifier 400 may include PMOS transistors P1 and P2 and NMOS transistors N1 and N2 which are coupled complementarily as a cross-coupled latch type between a pull-up voltage RTO and a pull-down voltage SB. The gate of the first PMOS transistor P1 and the gate of the first NMOS transistor N1 are coupled to the bit line BL, and the common drain of the first PMOS transistor P1 and the first NMOS transistor N1 is coupled to the bit line bar/BL. The gate of the second PMOS transistor P2 and the gate of the second NMOS transistor N2 are coupled to the bit line bar/BL, and the common drain of the second PMOS transistor P2 and the second NMOS transistor N2 is coupled to the bit line BL.

Figure 10B:
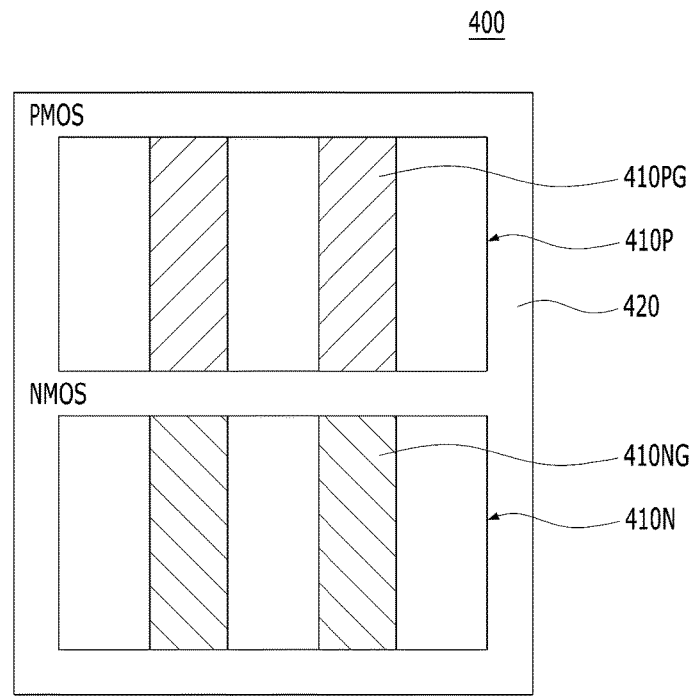
FIG. 10B is a plan view illustrating the sense amplifier shown in FIG. 10A.

FIG. 10B is a plan view illustrating the sense amplifier shown in FIG. 10A. Referring to FIG. 10B, the sense amplifier 400 is configured by 2 PMOS transistors and 2 NMOS transistors. The sense amplifier 400 may include a first active region 410P in which 2 PMOS transistors are formed and a second active region 410N in which 2 NMOS transistors are formed. Each of the 2 PMOS transistors may include a recess gate 410PG. Each of the 2 NMOS transistors may include a recess gate 410NG.

The recess gates 410PG and 410NG have been formed as described above and shown in FIGS. 1-9C. For example, the first active region 410P and the second active region 410N may be isolated from each other by an isolation region 420. The isolation region 420 may include diffusion barrier elements.

Figure 11A:
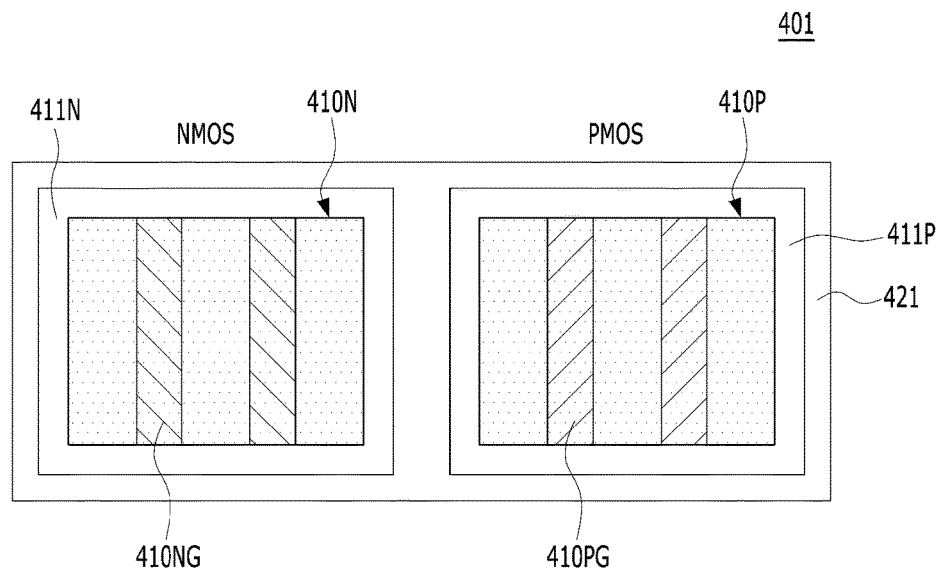
FIGS. 11A to 11D are plan views illustrating sense amplifiers according to embodiments.

FIGS. 11A to 11D are plan views illustrating sense amplifiers according to embodiments. Referring to FIG. 11A, a sense amplifier 401 is configured by 2 PMOS transistors and 2 NMOS transistors. An isolation region 421 may include a first diffusion barrier element 411P and a second diffusion barrier element 411N. The first diffusion barrier element 411P may have a shape that surrounds a first active region 410P. The second diffusion barrier element 411N may have a shape that surrounds a second active region 410N.

Figure 11B:
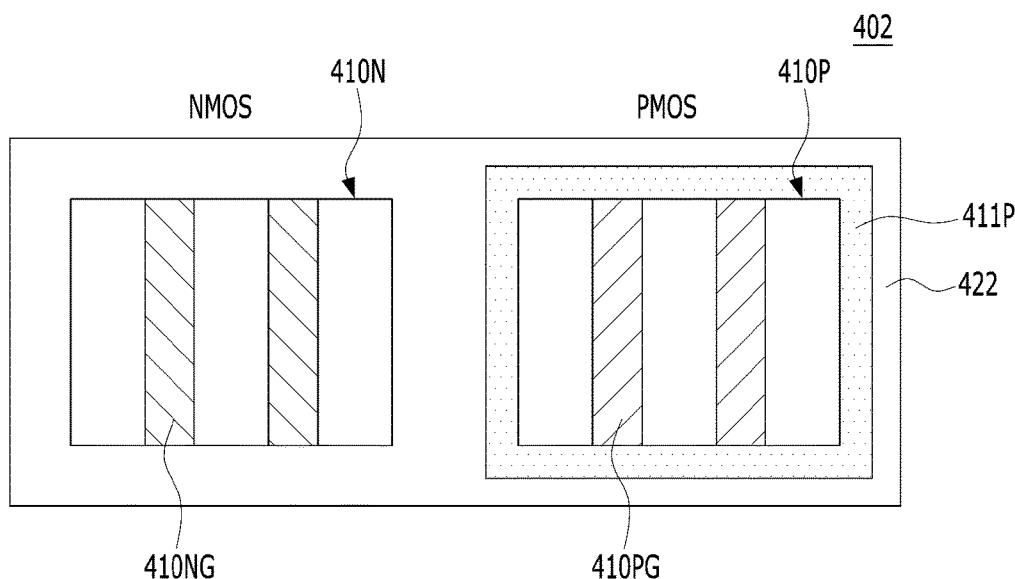

Referring to FIG. 11B, a sense amplifier 402 is configured by 2 PMOS transistors and 2 NMOS transistors. An isolation region 422 may include a first diffusion barrier element 411P. The first diffusion barrier element 411P may have a shape that surrounds a first active region 410P. A second active region 410N in which the NMOS transistors are formed may not be surrounded by any diffusion barrier. However, a buffer layer (not shown) may surround a lower portion of the second active region 410N.

Figure 11C:
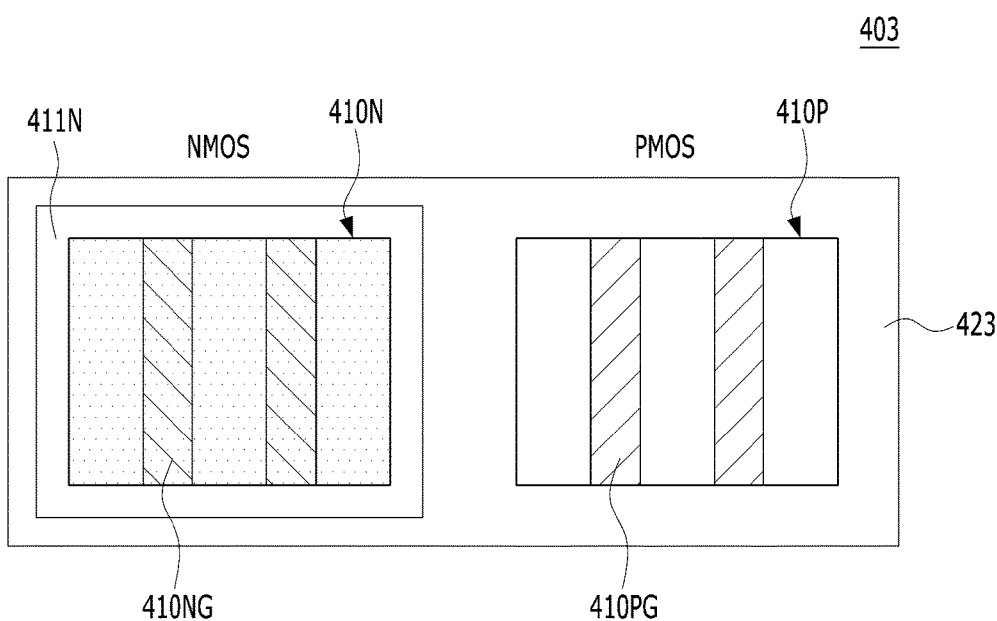

Referring to FIG. 11C, a sense amplifier 403 is configured by 2 PMOS transistors and 2 NMOS transistors. An isolation region 423 may include a second diffusion barrier element 411N. The second diffusion barrier element 411N may have a shape that surrounds a second active region 410N. A first active region 410P in which the PMOS transistors are formed may not be surrounded by any diffusion barrier. However, a buffer layer (not shown) may surround a lower portion of the first active region 410P.

Figure 11D:
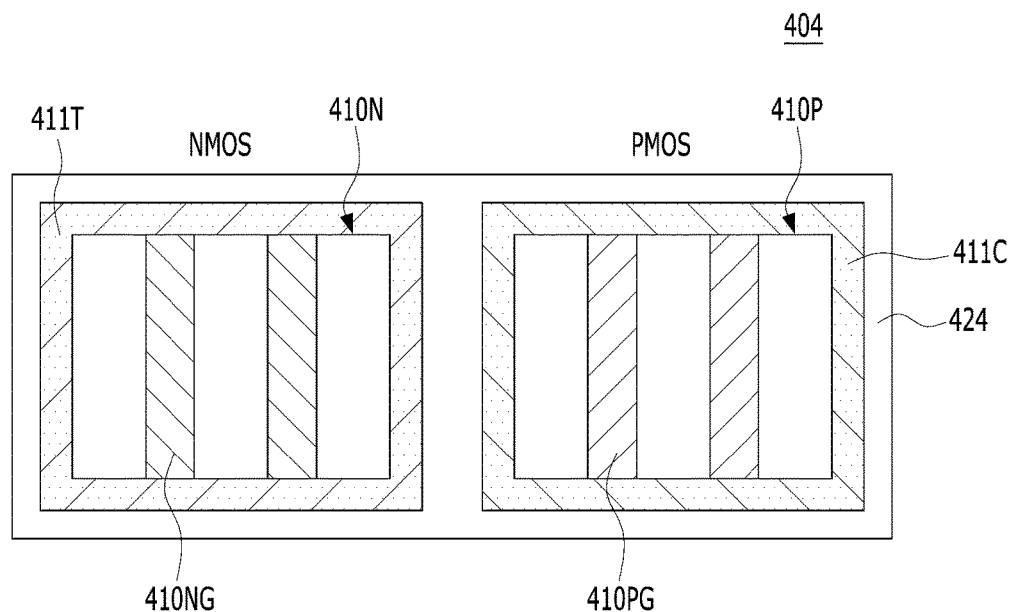

Referring to FIG. 11D, a sense amplifier 404 is configured by 2 PMOS transistors and 2 NMOS transistors. An isolation region 424 may include a first diffusion barrier element 411C and a second diffusion barrier element 411T. The first diffusion barrier element 411C may have a shape that surrounds a first active region 410P. The second diffusion barrier element 411T may have a shape that surrounds a second active region 410N. The first diffusion barrier element 411C and the second diffusion barrier element 411T may have different types of stress. For example, the first diffusion barrier element 411C may be a material that has a compressive stress. The second diffusion barrier element 411T may be a material that has a tensile stress.

FIGS. 12A to 12D are plan views illustrating sense amplifiers according to other application examples of the embodiments. As shown in FIGS. 12A to 12D, each of sense amplifiers 501, 502, 503 and 504 may include a first active region 510P in which 2 PMOS transistors are formed and a second active region 510N in which 2 NMOS transistors are formed. Each of the 2 PMOS transistors and the 2 NMOS transistors may include a recess gate.

In FIGS. 12A to 12D, the first active region 510P and the second active region 510N may be isolated from each other by isolation region 520, 521, 522 or 523. Each of the isolation regions 520, 521, 522 and 523 may include a diffusion barrier element described above and shown in FIGS. 1-9C.

Figure 12A:
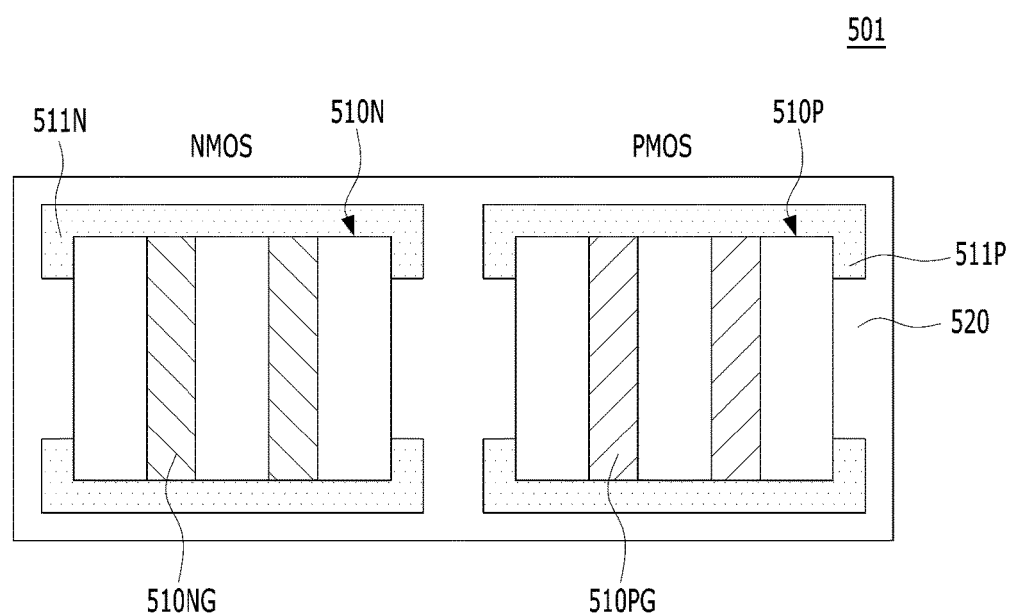
FIGS. 12A to 12D are plan views illustrating sense amplifiers according to other embodiments.

Referring to FIG. 12A, the isolation region 520 may include a first diffusion barrier element 511P and a second diffusion barrier element 511N. The first diffusion barrier element 511P may have a shape that partially surrounds the first active region 510P. The second diffusion barrier element 511N may have a shape that partially surrounds the second active region 510N. Each of the first diffusion barrier element 511P and the second diffusion barrier element 511N may have a shape that surrounds ends of recess gates that contact the isolation region 520. A diffusion barrier such as first diffusion barrier element 511P and second diffusion barrier element 511N may be referred to as an end-cap diffusion barrier.

Figure 12B:
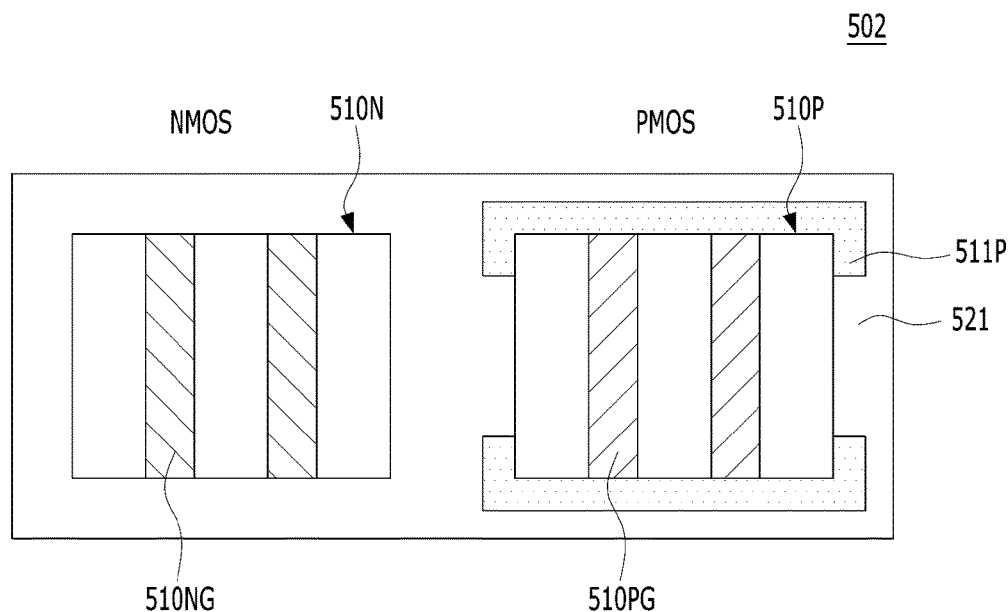

Referring to FIG. 12B, the isolation region 521 may include a first diffusion barrier element 511P. The first diffusion barrier element 511P may have a shape that partially surrounds the first active region 510P. The second active region 510N in which the NMOS transistors are formed may not be surrounded by any diffusion barrier. However, a buffer layer (not shown) may surround a lower portion of the second active region 510N.

Figure 12C:
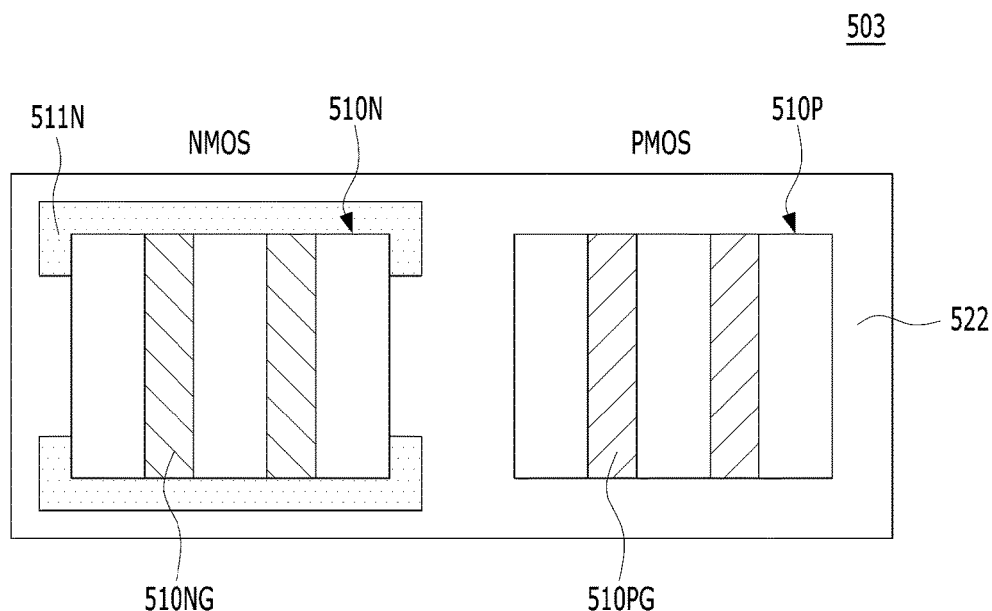

Referring to FIG. 12C, the isolation region 522 may include a second diffusion barrier element 511N. The second diffusion barrier element 511N may have a shape that partially surrounds the second active region 510N. The first active region 510P in which the PMOS transistors are formed may not be surrounded by any diffusion barrier. However, a buffer layer (not shown) may surround a lower portion of the first active region 510P.

Figure 12D:
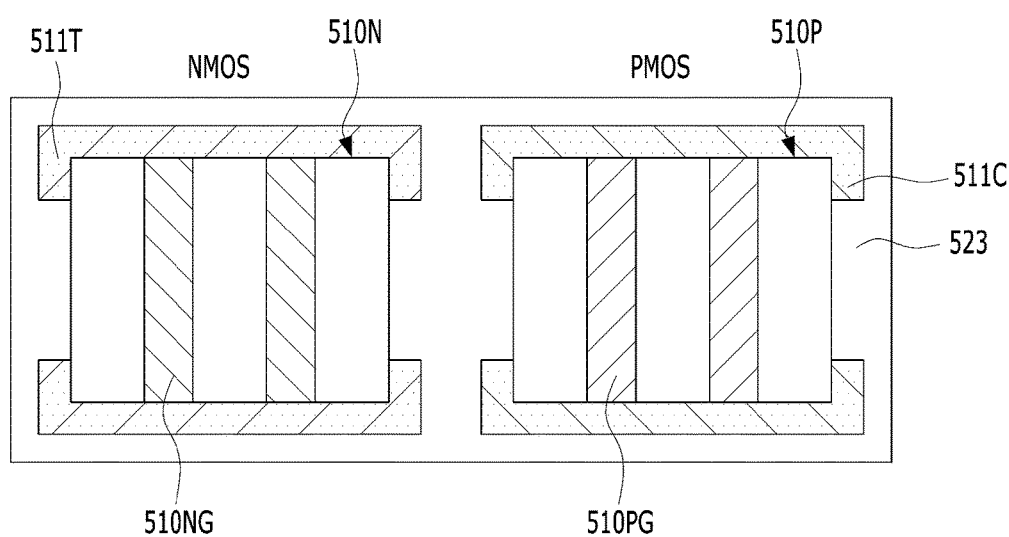

Referring to FIG. 12D, the isolation region 523 may include a first diffusion barrier element 511C and a second diffusion barrier element 511T. The first diffusion barrier element 511C may have a shape that partially surrounds the first active region 510P. The second diffusion barrier element 511T may have a shape that partially surrounds the second active region 510N. The first diffusion barrier element 511C and the second diffusion barrier element 511T may have different types of stress. For example, the first diffusion barrier element 511C may be a material that has a compressive stress. The second diffusion barrier element 511T may be a material that has a tensile stress.

According to the embodiments, by forming a diffusion barrier, it is possible to prevent out-diffusion of a dopant from a recess gate. Furthermore, according to the embodiments, by adjusting a thickness or a width of the diffusion barrier, a level of stress applied to a transistor can be controlled. Thus, performance of a semiconductor device may be improved due to boosting of mobility by a stress.

Although various embodiments have been described for illustrative purposes, it will be apparent to those skilled in the art that various changes and modifications may be made without departing from the spirit and scope of the invention as defined in the following claims.

What is claimed is:
1. A semiconductor device comprising:
a first active region including a first recess;
a second active region including a second recess;
a first recess gate filled in the first recess;
a second recess gate filled in the second recess; and
an isolation region surrounds the first active region and the second active region,
wherein the isolation region including a first stress-inducing layer surrounding a sidewall of the first active region and a second stress-inducing layer surrounding a sidewall of the second active region.
2. The semiconductor device according to claim 1, wherein the first stress-inducing layer has a tensile stress, and
wherein the second stress-inducing layer has a compressive stress.
3. The semiconductor device according to claim 1, wherein the first recess gate is a gate electrode of an NMOSFET, and the second recess gate is a gate electrode of a PMOSFET.
4. The semiconductor device according to claim 1, wherein the first recess gate comprises N-type doped polysilicon, and the second recess gate comprises P-type doped polysilicon.
5. The semiconductor device according to claim 1, wherein the semiconductor device includes a sense amplifier, and
wherein the sense amplifier includes the first recess gate and the second recess gate.
6. The semiconductor device according to claim 1, wherein the first stress-inducing layer and the second stress-inducing layer have heights and widths that cover both ends of the first recess gate and both ends of the second recess gate, respectively.
7. The semiconductor device according to claim 1, wherein the first stress-inducing layer and the second stress-inducing layer completely surround the sidewall of the first active region and the sidewall of the second active region, respectively.
8. The semiconductor device according to claim 1, wherein the first stress-inducing layer partially surrounds the sidewall of first active region, and
wherein the second stress-inducing layer partially surrounds the sidewall of the second active region.

* * * * *